(12) United States Patent
Taussig et al.

(10) Patent No.: US 6,552,409 B2
(45) Date of Patent: Apr. 22, 2003

(54) TECHNIQUES FOR ADDRESSING CROSS-POINT DIODE MEMORY ARRAYS

(75) Inventors: Carl Taussig, Redwood City, CA (US); Richard Elder, Palo Alto, CA (US)

(73) Assignee: Hewlett-Packard Development Company, LP, Houston, TX (US)

(*) Notice: Subject to any disclaimer, the term of this patent is extended or adjusted under 35 U.S.C. 154(b) by 0 days.

(21) Appl. No.: 09/875,572

(22) Filed: Jun. 5, 2001

(65) Prior Publication Data

US 2002/0192895 A1 Dec. 19, 2002

(51) Int. Cl.$^7$ ............................................... H01L 29/00
(52) U.S. Cl. ..................... 257/529; 257/530; 257/257; 257/910
(58) Field of Search ........................... 257/910, 529–530

(56) References Cited

U.S. PATENT DOCUMENTS

| | | | | |
|---|---|---|---|---|
| 4,089,734 A | * | 5/1978 | Bierig | ........................ 216/16 |
| 4,569,120 A | * | 2/1986 | Stacy et al. | .......... 148/DIG. 55 |
| 4,677,742 A | * | 7/1987 | Johnson | .................. 148/DIG. 1 |

* cited by examiner

Primary Examiner—Jey Tsai

(57) ABSTRACT

A memory array and some addressing circuitry therefor are formed by creating circuit elements at the crossing-points of two layers of electrode conductors that are separated by a layer of a semiconductor material. The circuit elements formed at the crossing-points function as data storage devices in the memory array, and function as connections for a permuted addressing scheme for addressing the elements in the array. In order to construct the addressing circuitry, the electrode conductors are fabricated with a controlled geometry at selected crossing-points such that selected circuit elements have increased or decreased cross-sectional area. By applying a programming electrical signal to the electrodes, the electrical characteristics (e.g. resistance) of selected circuit elements can be changed according to the controlled electrode geometry.

19 Claims, 17 Drawing Sheets

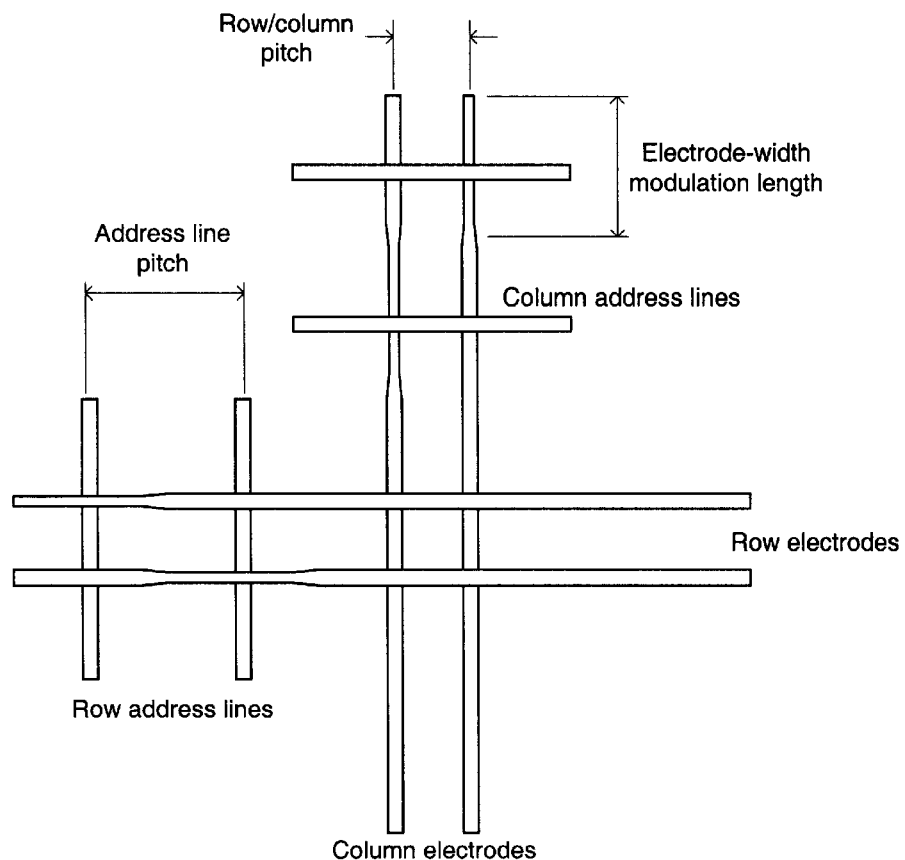
Figure 12
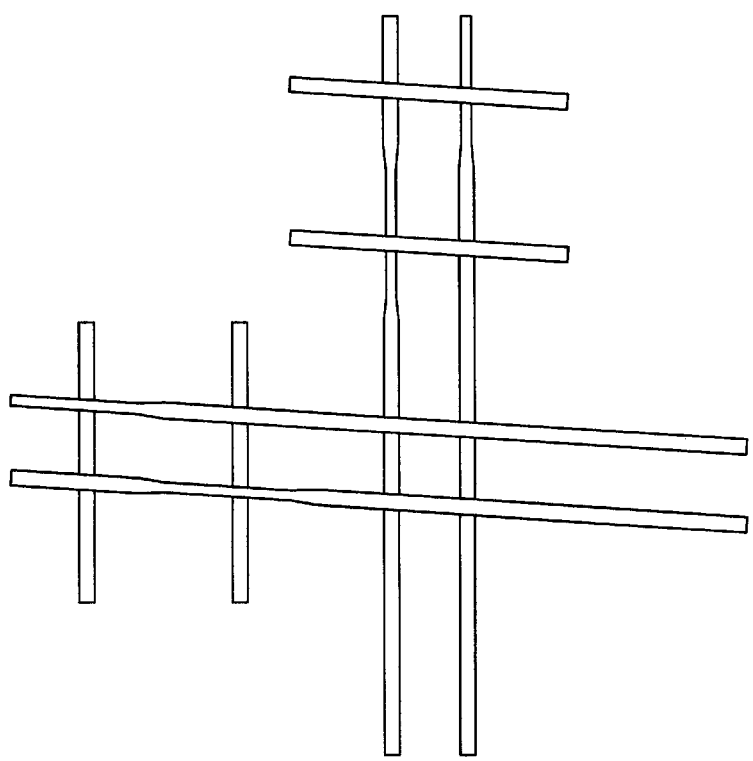

TECHNIQUES FOR ADDRESSING CROSS-POINT DIODE MEMORY ARRAYS

FIELD OF THE INVENTION

The present invention relates to the field of digital memory circuits, and in particular to fabrication techniques for addressing and sensing circuitry for accessing memory elements in a cross-point diode memory arrays.

BACKGROUND OF THE INVENTION

Many consumer devices are now constructed to generate and/or utilize digital data in increasingly large quantities. Portable digital cameras for still and/or moving pictures, for example, generate large amounts of digital data representing images. Each digital image may require up to several megabytes (MB) of data storage, and such storage must be available in the camera. To provide for this type of data storage application, the storage memory should be relatively low in cost for sufficient capacities of around 10 MB to 1 gigabyte (GB). The storage memory should also be low in power consumption (e.g. <<1 Watt) and have relatively rugged physical characteristics to cope with the portable battery powered operating environment. For archival storage, data need only be written to the memory once.

One suitable form of archival storage is described in co-pending U.S. patent application Ser. No. 09/875,356, entitled "Non-Volatile Memory", the disclosure of which is hereby incorporated herein by reference. The memory system disclosed therein provides high capacity write-once memory at low cost for archival storage. This is realized in part by avoiding silicon substrates, minimizing process complexity and lowering areal density. The memory system includes a memory module formed of a laminated stack of integrated circuit layers constructed on plastic substrates. Each layer contains cross-point diode memory array, and sensing of the data stored in the array is carried out from a separate integrated circuit remotely from the memory module. In order to address, read from and write to all of the memory elements in the arrays of the various memory module layers, a multiplexing scheme is required to avoid having too many interconnections between the memory module and the remote sensing circuitry.

In conventional integrated circuits multiplexing is accomplished by logic gates synthesized from transistors. It is undesirable to include transistors in a diode based cross-point memory array because they will add to the required processing thereby increasing the fabrication cost. Some of the additional processing may be incompatible with other materials used in the cross-point array. If plastic substrates or organic semiconductors are used to form the cross-point memory array, for example, they may be destroyed by temperatures required for transistor fabrication, or they could be damaged by certain solvents used in a wet etching process. Recently, researchers at Lawrence Livermore Laboratories have demonstrated the fabrication of thin-film-transistors on a plastic substrate, however the process required is much more complicated, and hence more expensive, than the equivalent process required to fabricate diodes.

Electrostatic micro-relays have been developed for a number of applications including power relays for automotive application, and small signal switching for instrumentation and automatic test equipment. Electrostatic micro-relay systems are described, for example, in Wong, Jo-Ey, et al., "An Electrostatically-actuated MEMS Switch for Power Applications", (Micro Electro-Mechanical Systems, 2000. MEMS '00. Thirteenth IEEE. 2000), and Zavracky, P. M., et. al., "Micro-mechanical switches fabricated using nickel surface micro-machining", (Micro-electromechanical Systems, Journal of, 1997.6(1): p3–9). The principle advantages of this technology are low power consumption and simplicity of construction. Switches of this kind could possibly be used for memory address multiplexing circuitry, although the fabrication processing for these devices is still more significant than that required for a diode array, particularly if a low contact resistance is required.

Another address multiplexing possibility, code-word addressing, includes a number of approaches which have been used to minimize the interconnections to a pixelated display. Such systems are described, for example, in the specification of International Patent Application Publication WO 98/44481, and U.S. Pat. No. 5,034,736. In general code word addressing trades off the ratio of addressing lines to array electrodes and the cross-talk between selected and de-selected electrodes. Although these solutions do not offer log-base-2 reduction in interconnect, they may offer better than 10:1 ratio of electrode to address line, while maintaining a 4:1 cross-talk ratio. Although these solutions are simple to implement since they only involve two-level metal and resistor networks, they require a higher number of address lines for a given number of addressed lines than the true multiplexing schemes described previously. A further disadvantage of these schemes is the cross-talk introduced between addressed and non-addressed memory elements, which makes it difficult to read and write a particular memory element.

SUMMARY OF THE INVENTION

In accordance with the principles of the present invention, there is provided an integrated circuit structure comprising a first conductor layer having first and second conductor lines, and a second conductor layer having a third conductor line in a crossing relationship with the first and second conductor lines. An intermediate layer having at least one semiconductor material is interposed between the first and second conductor layers at least where the third conductor line crosses the first and second conductor lines so as to form first and second circuit elements through the intermediate layer at the respective crossing junctions of the first and second conductor lines with the third conductor line. The geometry of the first, second and/or third conductor lines at the crossing junctions being such that, upon application of a predetermined electrical signal through the first and second circuit connection elements, the first circuit connection element undergoes a permanent substantial change in resistance with respect to the second circuit connection element.

Preferably the geometry of the first, second and/or third conductor lines is constructed such that said predetermined electrical signal effects a greater electrical current density through the first circuit connection than the second circuit connection.

In a preferred form of the invention the geometry of the first, second and/or third conductor lines is constructed such that the width of the second and/or third conductor lines is broadened in the region of the crossing junction thereof as compared to the crossing junction of the first and third conductor lines.

In one form of the invention, following application of said predetermined electrical signal, the first circuit connection element has a substantially higher resistance than the second circuit connection element.

In another form of the invention, following application of said predetermined electrical signal, the first circuit connection element has a substantially lower resistance than the second circuit connection element.

Preferably the circuit connection elements include a diode formed in the intermediate layer.

The present invention also provides a method of forming integrated circuit connection elements. First, second and third conductor lines are formed, the first and second conductor lines crossing the third conductor line separated by a layer having at least one semiconductor material forming first and second circuit connection elements through the layer at the crossing junctions of the respective first and second conductor lines with the third conductor line. The geometry of the first, second and/or third conductor lines at the crossing junctions are controlled so that, upon application of a predetermined electrical signal through the first and second circuit connection elements, the first circuit connection element undergoes a permanent substantial change in resistance with respect to the second circuit connection element.

In one form of the invention the geometry of the first, second and/or third conductor lines are controlled such that the cross-sectional area of the crossing junction forming the first circuit element is smaller than the cross-sectional area of the crossing junction forming the second circuit element such that the predetermined electrical signal effects a substantially higher current density in the first circuit element as compared to the second circuit element.

Preferably the width of the first and/or third conductor lines is narrowed in the region of the crossing junction forming the first circuit element.

Preferably the first and second circuit elements each include a diode formed in said layer.

In accordance with the present invention there is further provided a method for forming a circuit comprising forming a first conductor line, and forming a plurality of second conductor lines arranged to cross the first conductor line. The first and second conductor lines are separated at the crossing points by a layer having at least one semiconductor material. The geometry of the first conductor line and/or the second conductor lines is controlled such that application of a predetermined electrical signal between the first and second conductor lines effects a substantial permanent relative change in said layer at the crossing points according to the geometry.

Controlling the geometry may include controlling the width of the first and/or second conductor lines at the crossing points. For example, the line widths can be controlled such that the overlapping area of first and second conductor lines of a plurality of said crossing points comprise large area and small area crossing points.

In the preferred embodiment, the layer undergoes a permanent substantial change in resistance in the region between the small area crossing points as a result of the predetermined electrical signal.

In accordance with the present invention there is further provided an addressing circuit for a cross-point memory array having array electrode lines, the addressing circuit comprising at least one address line arranged to cross the array electrode lines, the array electrode lines and at least one address line being separated at the respective crossing junctions by a layer having at least one semiconductor material wherein circuit elements are formed through the layer at said junctions, the geometry of the at least one address line and/or the array electrode lines being constructed at the junctions such that application of a predetermined electrical signal through the circuit elements results in substantial alteration of resistance of selective the circuit elements according to the geometry.

The construction geometry may comprise broadened or narrowed portions of the at least one address line and/or at least one of the array electrode lines at the junctions.

The circuit elements preferably include respective diodes formed by said layer.

In the preferred embodiment, the circuit elements formed at the junctions of narrowed address and/or array electrode lines undergo a substantial change in resistance as a result of application of the predetermined electrical signal.

The present invention further provides a method of forming addressing circuitry. The method includes forming a first set of conductor lines, and forming a second set of conductor lines transverse to said first conductor lines such that said first and second conductor lines have respective crossing junctions at which the conductor lines from the first and second sets are separated by a layer having at least one semiconductor material. The geometry of the first and/or second conductor lines are controlled so that said crossing junctions comprise first and second sets of junctions having different geometry. The method further includes applying a predetermined electrical signal through the first and second conductor lines whereby a substantial permanent change in electrical resistance occurs in the first set of crossing junctions and not in the second set of crossing junctions.

Preferably, controlling the geometry comprises forming narrowed width portions of the first and/or second conductor lines at selected ones of the crossing junctions.

BRIEF DESCRIPTION OF THE DRAWINGS

The invention is described in greater detail hereinafter, by way of example only, through description of a preferred embodiment thereof and with reference to the accompanying drawings in which:

FIG. 12 is a diagrammatic view of several electrodes for the illustration of misalignment considerations at fabrication;

DETAILED DESCRIPTION OF THE PREFERRED EMBODIMENT

Write-once memory circuits, storage systems, addressing and sensing circuits and methods for producing, implementing and using such circuits and systems are disclosed herein. In the following description, for purposes of explanation, specific nomenclature and specific implementation details are set forth to provide a thorough understanding of the present invention. However, it will be apparent to one skilled in the art that these specific details are not necessarily required in order to practice the present invention.

In the following description, where "data" is referred to it will be appreciated that such "data" may be represented in various ways depending upon the context. As an example, "data" in a memory cell might be represented by a voltage level, a magnetic state, or a physical characteristic such as electrical resistance that presents a measurable effect such as voltage or current level or change to a sensing circuit, for instance. On the other hand, whilst on a bus or during transmission such "data" might be in the form of an electrical current or voltage signal. Furthermore, herein "data" in most circumstances is primarily binary in nature which may for convenience be referred to as represented by states of "0" and "1", but it will be appreciated that the binary states in practice might be represented by relatively different voltages, currents, resistances or the like and it is generally immaterial whether a particular practical manifestation represents a "0" or a "1".

A preferred embodiment of the present invention comprises an addressing circuit, a method of formation thereof, and a method of addressing cross-point diode memory arrays of the type utilized in the memory system described in the aforementioned co-pending U.S. patent. In order to provide a thorough understanding of the invention, the following detailed description is therefore presented in the context of such a memory system, although those skilled in the art will recognize that the invention is not limited in application to the described structure.

A Write-Once Memory System

Figure 1:
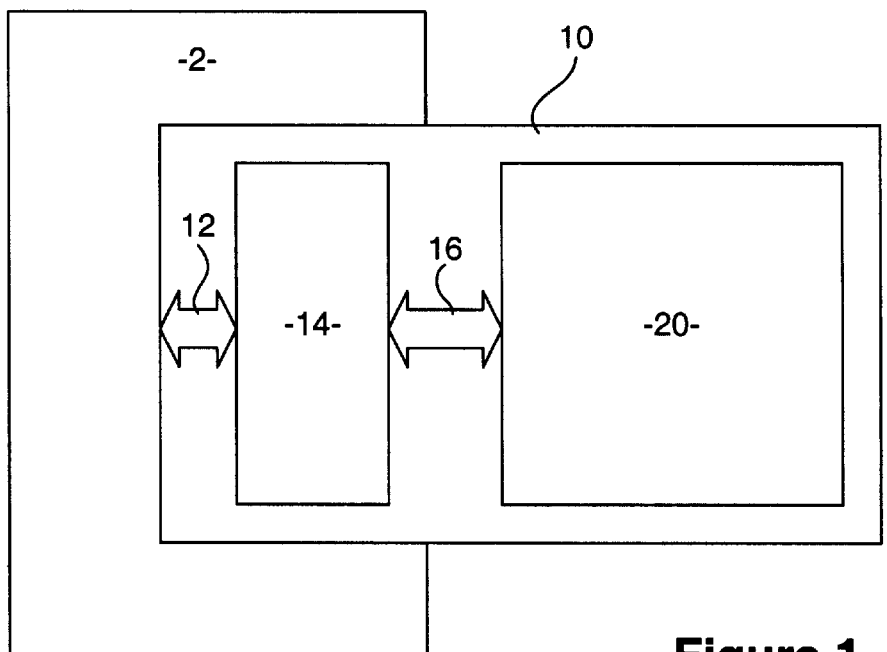
FIG. 1 is a block diagram of a write-once memory system according to an embodiment of the invention.

A portable, inexpensive, rugged memory system that is particularly useful for data storage in applications such as digital cameras and portable digital audio devices, amongst other things, is embodied by the memory card 10 illustrated in block diagram form in FIG. 1. The memory system is preferably incorporated into an industry standard portable interface card (e.g. PCMCIA or CF) so that it can be used in existing and future products with such interfaces. The memory card 10 has an I/O interface connector 12 through which communication is made between the card 10 and a device 2 to which it is coupled. The interface connector is coupled to an interface and control circuit 14 which is connected to a removable memory module 20. The memory module 20 provides circuitry for write-once data storage. The interface and control circuit 14 comprises circuitry for control, interface, detection, error correction coding (ECC) and the like for each removable memory module 20 when it is received in the card. The memory module 20 is received in a socket or the like in the memory card, so that it may be removed therefrom and replaced with another memory module 20. When received in the memory card, the memory module 20 is coupled to the interface and control circuit 14 through an internal interface 16.

Write-once data storage means that, effectively, data can only be written once to the memory and thereafter it remains unchangeable. In many forms of write-once memory it is not strictly true that the data stored therein cannot be changed at all after being initially written, however in general it cannot be changed arbitrarily, as those skilled in the art will appreciate. For example, most write-once memories are fabricated with each memory cell in a first binary state (e.g. representing a binary data "0"), and during a write procedure selected memory cells are changed into a second binary state (e.g. to represent the binary data "1"s). Often the change in the memory from the first binary state to the second is irreversible, such that once a data "1" is written it cannot be changed back to a data "0". This restricts the changes to the stored data that can be made after it has been written to the memory, wherein arbitrary data can only be written once and thereafter data "0"s, for example, can only be changed to data "1"s, and not the other way around.

Since the memory module 20 contains write-once memory, it is appropriate for archival data storage wherein the data, once stored, is preserved. This is somewhat like a photographic film, where pictures are stored thereon once, and the developed film is kept as a permanent record. Therefore, once the memory module 20 has been filled to capacity with data, another is required for further data storage. It would be possible to simply replace the entire memory card 10 in the device 2, however that would mean the interface and control circuitry, as well as the memory card structure, is archived along with the memory module. In order to reduce the data storage costs it is desirable that reusable and relatively expensive components of the memory system not be permanently coupled to the actual storage memory, and for that reason the memory module 20 is removable from the memory card 10 in the preferred embodiment. The bulk of the memory card 10 thus involves a one-off cost, and the memory modules 20 for insertion therein are fabricated inexpensively as discussed further hereinbelow.

The control/interface circuitry 14 may generally resemble an "AT" style disk controller circuit, further including error correction (ECC) and defect management functions, as well as functions required to operate the memory module 20. These functions include:

writing to the memory module including setting write voltages, setting write enable lines and controlling power supply striping;

addressing the memory by converting logical addresses to address line patterns required to access physical memory locations;

data read processing of sense line outputs; and parallel to serial conversion if required.

The control/interface circuitry 14 may also provide functions to emulate certain features of rewritable memory cards, such as logical deletion of data files and the like. Such functions of the interface/control circuitry 14 can be implemented without difficulty in a custom integrated circuit, for example. The details of the required functions outlined above will become more fully understood from the following description of the structure and operation of the memory module 20 itself.

For coupling between the interface/control circuitry 14 and memory module 20 in the memory card 10, the internal interface 16 is provided. Physically, the internal interface 16 receives the memory module and provides electrical connections between the interface and control circuitry and memory module. Thus, a suitable form of plug and socket arrangement may be employed, although the most appropriate structure depends strongly upon the actual number of connections to be made. Connecting contacts on the memory module can be formed on the external surface thereof, for example as described hereinafter, to enable edge connection schemes or land grid array (LGA) connections. Many kinds of connection schemes are possible, as will be recognized by those of skill in the art, for implementation without undue difficulty.

A Write-Once Memory Module

The memory module 20 can be constructed inexpensively utilizing the principles of the present invention, so as to provide a low cost per unit of data storage. In order to keep the memory cost low whilst achieving high storage capacities, several factors have been addressed, such as material and processing costs. Such features of the memory module are discussed in the description hereinbelow, beginning with the general structure of the memory module 20.

Figure 2:
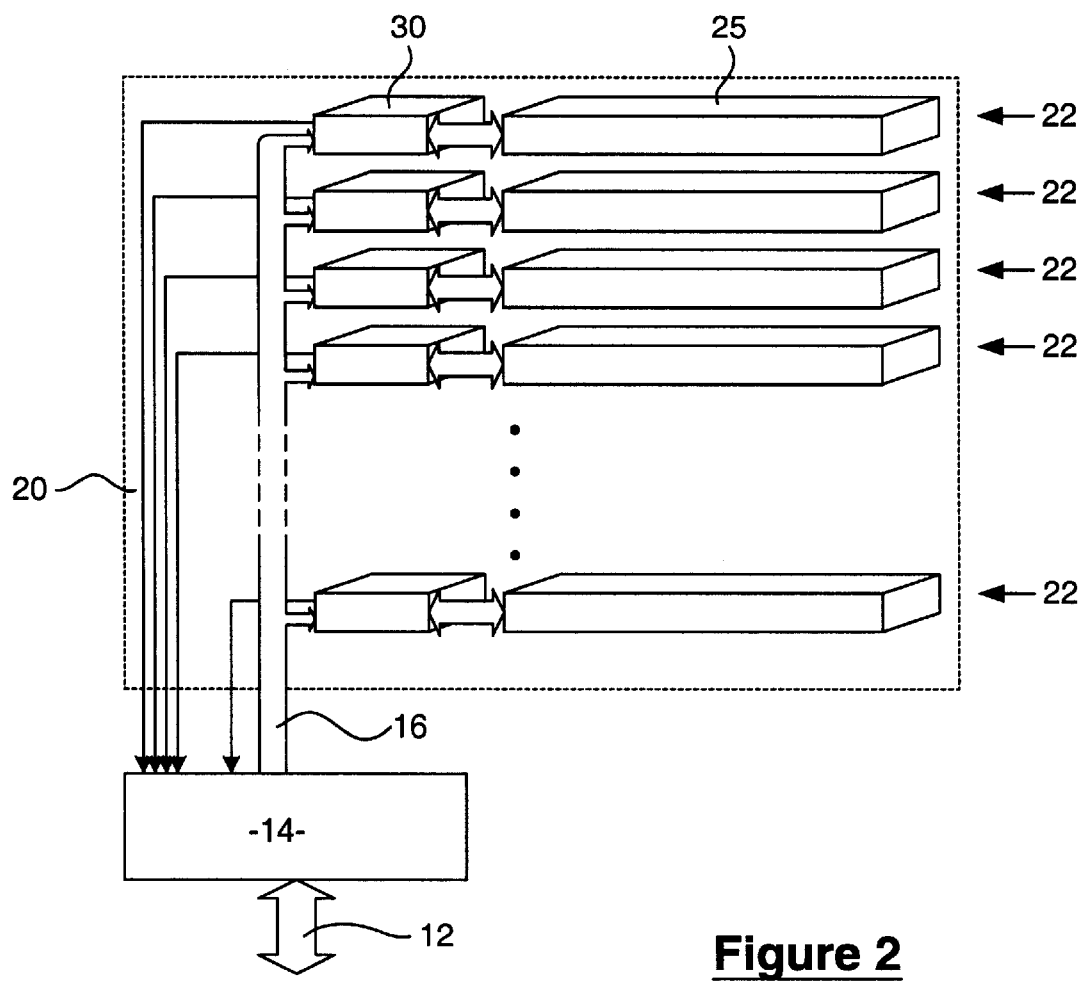
FIG. 2 is a schematic block diagram of the write-once memory system illustrating the general structure of a memory module thereof.

A diagrammatic block representation of a memory module 20 is shown in FIG. 2, coupled to an interface and control circuit 14. In order in increase storage capacity of the memory module for a given base area, the module 20 is constructed from a stack of laminated layers 22. Each layer 22 has an array 25 or arrays of memory elements that provide the data storage. The layers also each include addressing circuitry 30 coupling the respective memory arrays through the memory system internal interface 16 to the interface and control circuit 14. The addressing circuitry on each layer enables fewer interconnecting conductors between the layers of the memory module and from the memory module to external circuitry, which facilitates ease of fabrication and thus lowered costs.

Figure 3:
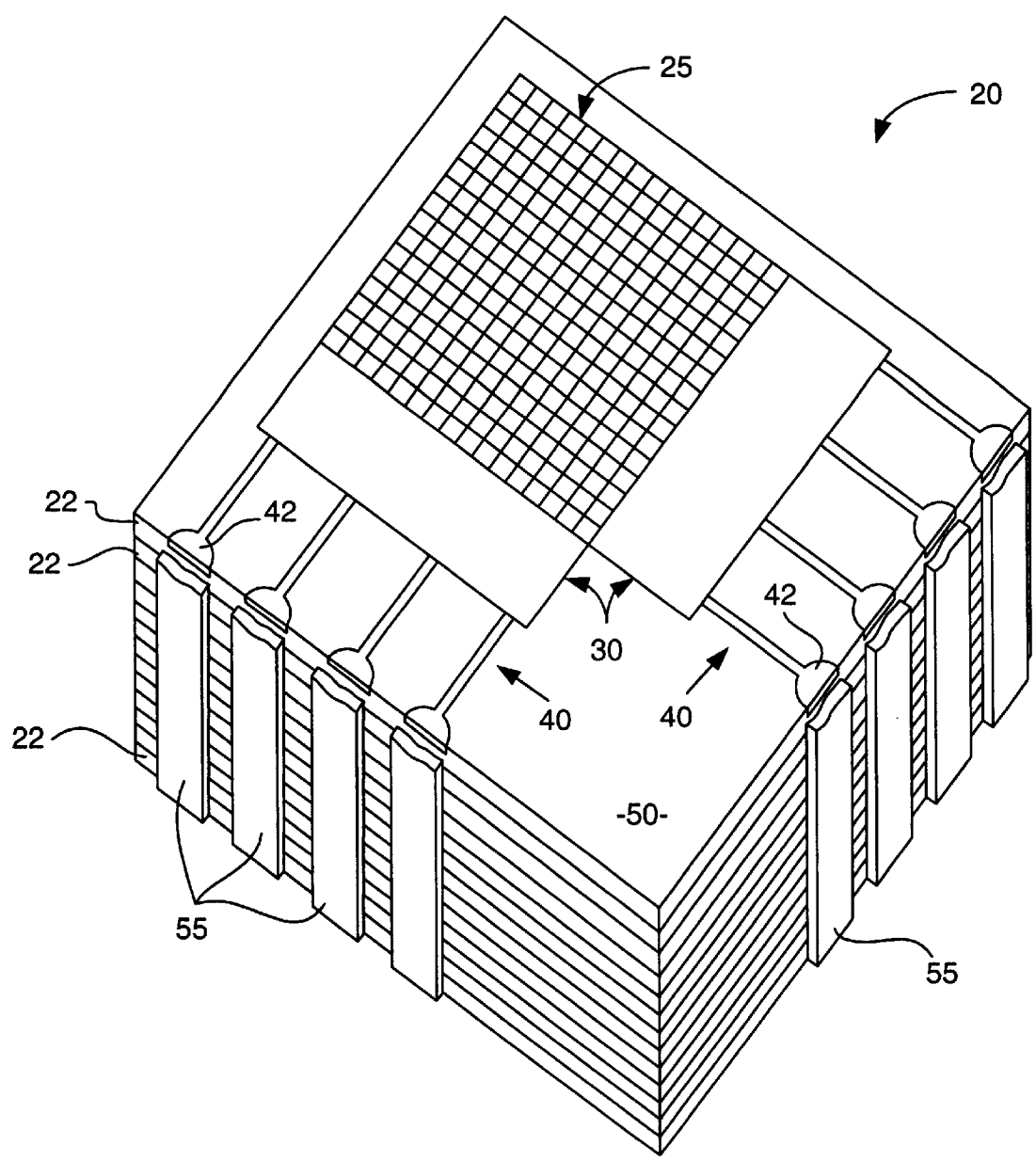
FIG. 3 is a cut-away isometric view of a write-once memory module constructed in accordance with an embodiment of the invention.

FIG. 3 is a cut-away isometric view of a memory module 20, illustrating a possible physical arrangement of circuits and layers in the memory module. Each of the layers 22 comprises a memory array 25 and addressing circuits 30 formed on a substrate 50. The memory array 25 comprises a matrix of memory elements 26. The addressing circuits 30 comprise column and row multiplexing circuit portions that are positioned adjacent respective orthogonal edges of the memory array 25. Input/output (I/O) leads 40 are also formed on the substrate during the fabrication process. In the memory module 20, row I/O leads extend from the row multiplexing circuit portion to a first adjacent edge of the substrate, and column I/O leads extend from the column multiplexing circuit portion to a second adjacent edge of the substrate. Each of the leads 40 terminate at respective contact pads 42, portions of which are exposed at the edges of the substrate 50.

A plurality of layers 22 are stacked in the same orientation and laminated together. Electrical contact is made to the exposed portions of the contact pads 42 of the stacked layers by conductive contact elements 55, which are illustrated in partial cut-away view in FIG. 3. The contact elements 55 extend along the sides of the memory module 20, transverse to the plane of the individual layers 22. Each contact element 55 as illustrated makes electrical contact to a respective contact pads of a plurality of the layers in the stack. The contact elements 55 can be used to couple the memory module 20 through the memory system internal interface 16 to the interface and control circuit 14.

In the preferred implementation of the memory module the substrate 50 for each of the layers 22 is formed from a thin inexpensive material such as a plastic (e.g. polyimide, polyester) or metal (e.g. dielectric coated stainless steel film). The process by which the integrated circuits (e.g. memory array and mux/demux circuitry) are formed on the substrate, and the layers assembled into a memory module is described in greater detail hereinbelow. Preceding discussion of the fabrication processes and materials, however, is a description of the memory module circuitry, in particular the memory array and elements and the integrated multiplexing scheme.

A Write-Once Memory Array

Figure 4:
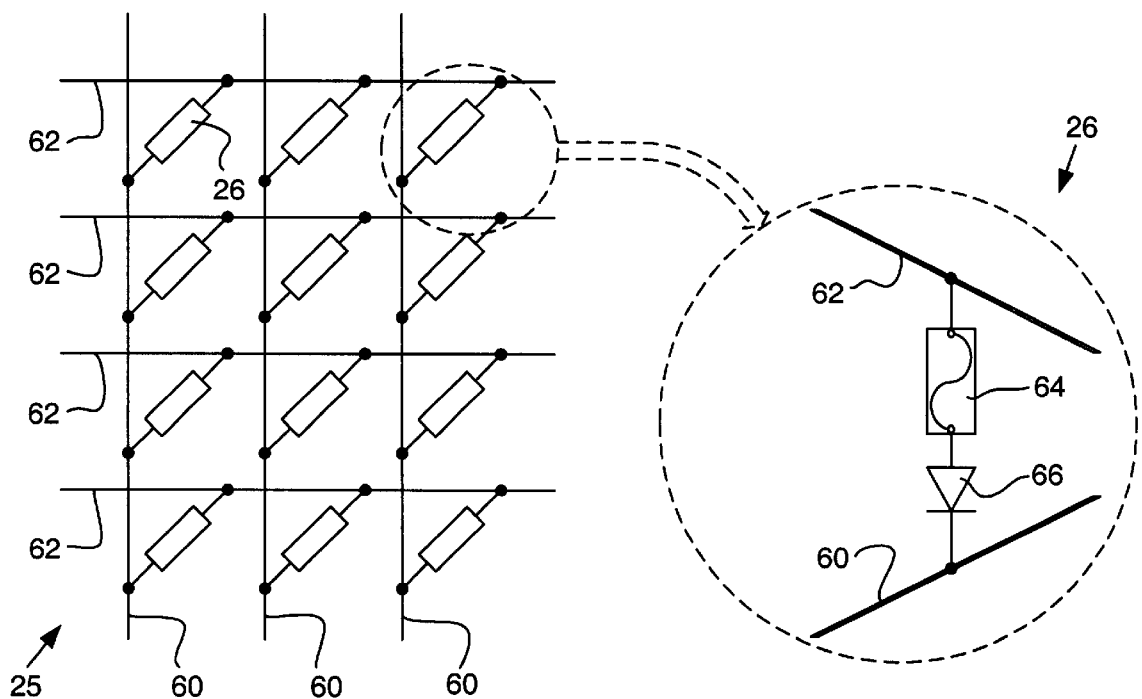
FIG. 4 is a pictorial diagram of a cross-point memory element suitable for implementation in embodiments of the invention.

An array 25 of memory elements 26 is formed on each of the layers in the memory module 20. The memory array comprises a regular matrix of column lines and row lines with a memory element at each column/row intersection. FIG. 4 illustrates a schematic diagram of a portion of a memory array 25 having column lines 60 and row lines 62. Coupled between each of the column lines and row lines is a memory element 26, which is also shown in greater detail in an expanded portion of the diagram in FIG. 4. In the preferred implementation of the memory array, each memory element 26 schematically comprises a fuse element 64 coupled in series with a diode element 66. The fuse element 64 provides the actual data storage effect of the memory element, whilst the diode 66 facilitates addressing of the memory element using the row and column lines for writing and reading data.

The operation of the memory array 25 is as follows. At fabrication, each of the memory elements 26 has a fuse element 64 that is conductive. The conductive state of the fuse element represents one binary data state, say a data "0". In order to write data to the memory array, each memory element in which it is desired to store a data "1" is addressed using the column and row lines and the fuse element therein is "blown", placing it in a non-conductive state. The non-conductive state of the fuse element represents the other binary data state, say a data "1". Blowing the fuse element is, in most cases, a one-way operation, which makes the memory a "write-once" storage, as discussed hereinabove. A data writing operation (e.g. writing a data "1" to a selected memory element) can be performed by applying a predetermined current through a selected row line to a selected column line, for example, sufficient to blow the fuse of the memory element that directly interconnects those row/column lines. Data can be read from the memory array by addressing memory elements using the column and row lines and sensing which memory elements are conductive (data "0"s) and which are non-conductive (data "1"s). More generally, the binary data states of memory elements are distinguished by some ratio between "conductive" resistance and "non-conductive" resistance.

It will be appreciated that, although the above description refers to fuse elements in the memory array that are fabricated in a low resistance state and blown to create a high resistance state, it is equally possible to create a memory array using "anti-fuse" elements that operate in the opposite manner. In that case, the memory elements are fabricated in a high resistance state, and blown to create a low resistance. The anti-fuse in each memory element is also formed in series with a diode for the reasons mentioned above. The diode and anti-fuse are separate in this case, since the diode function is required after the anti-fuse has been blown.

A mandatory characteristic for the fuse or anti-fuse element is that its resistance change between a high state and a low state irreversibly or the reverse at some critical current threshold. The change in resistance must be substantial: several orders of magnitude. The critical current of the fuses should also be controllable by the area of the devices. The area of the device may simply be determined by the area of intersection of the row and column electrodes or may be lithographically defined. The fuse and diode elements can be formed from a number of thin films deposited in series between the row and column electrodes. The individual memory elements occur at the intersection of the row and column electrodes. Although the fuse and diode layers are deposited as contiguous films covering the entire area, they may be patterned by a number of means (laser ablation, photolithography, soft lithography) to minimize cross talk between individual devices.

The diode element 66 in each memory element 26 of the array assists in addressing the memory elements uniquely using the column and row lines for writing and reading data. Without a diode in the row/column cross-point memory elements there are current paths through many memory elements between a given column line and row line. However, with the diode elements forming a one-way conduction path through each memory element, a single column line and single row line can be used to uniquely address a single memory element. In other words, forming a circuit from one row line to one column line permits current to pass through only a single memory element. By applying a predetermined "data writing" current through that circuit, the fuse in the memory element can be blown to change a data "0" to a data "1". Also, by sensing the resistance in the circuit it is possible to determine whether the memory element fuse is blown or intact, thereby reading a data "1" or data "0".

Thus, the diodes 66 eliminate cross-talk between the memory elements in the memory array during reading and writing operations. Furthermore, the non-linear current-voltage (I-V) characteristics of the diodes improves the data sensing signal-to-noise ratio (SNR), which assists in remote sensing and code-word addressing. The data in the memory module is sensed remotely since the sensing circuitry is in the interface and control circuit 14, which is contained in a separate integrated circuit. Also, permuted diode logic is employed for addressing of the memory elements, using the mux/demux circuits as described hereinbelow, in order to reduce the number of connections required between the memory module 20 and the interface and control circuit 14.

Figure 5:
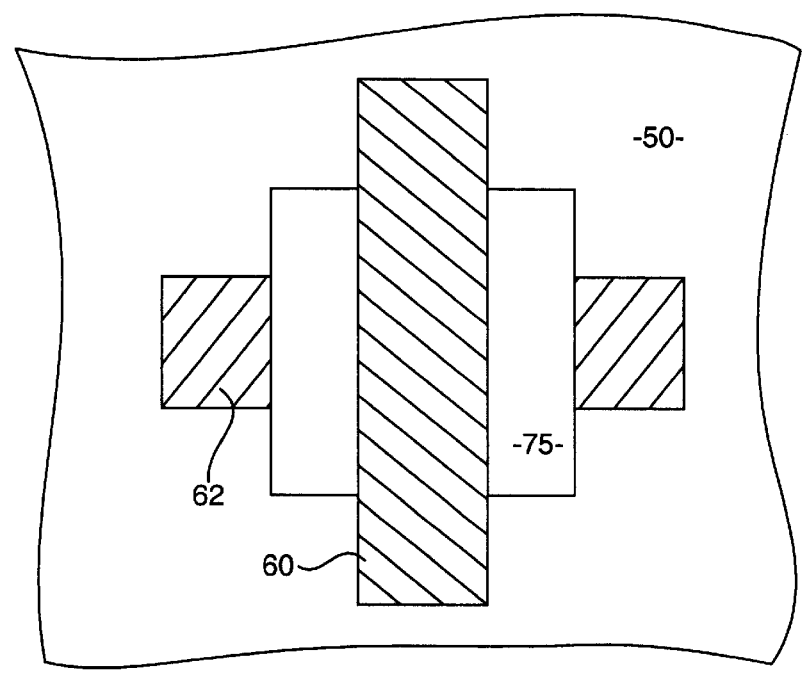
FIG. 5 is a simplified plan view of a cross-point array memory unit cell.

The memory array is sometimes herein referred to as a cross-point array memory in view of the structure thereof, and FIG. 5 provides a simplified plan view of a unit cell of the memory array of the preferred embodiment. The basic structure of the cross-point array memory comprises two layers of orthogonal sets of spaced parallel conductors arranged with a semiconductor layer therebetween. The two set of conductors form row and column electrodes overlaid in such a manner that each of the row electrodes intersects each of the column electrodes at exactly one place. At each of these intersections a connection is made between the row electrode (62 in FIG. 5) and column electrode (60 in FIG. 5) through the semiconductor layer (75 in FIG. 5) which acts in the manner of a diode and a fuse in series. The diodes in the array are all oriented so that if a common potential is applied between all the row electrodes and all the column electrodes then all the diodes will be biased in the same direction. The fuse element may be realized as a separate element that will open-circuit when a critical current is passed therethrough or it may be incorporated in the behavior of the diode.

Although commonly in this description the semiconductor layer (e.g. 75) is referred to in the singular, in practice a plurality of layers of different materials may be employed. The layers may include materials that are not semiconductors, such as metals and even dielectrics in various configurations. The materials and structures suitable for implementing the desired functions are described in detail elsewhere.

Figure 6:
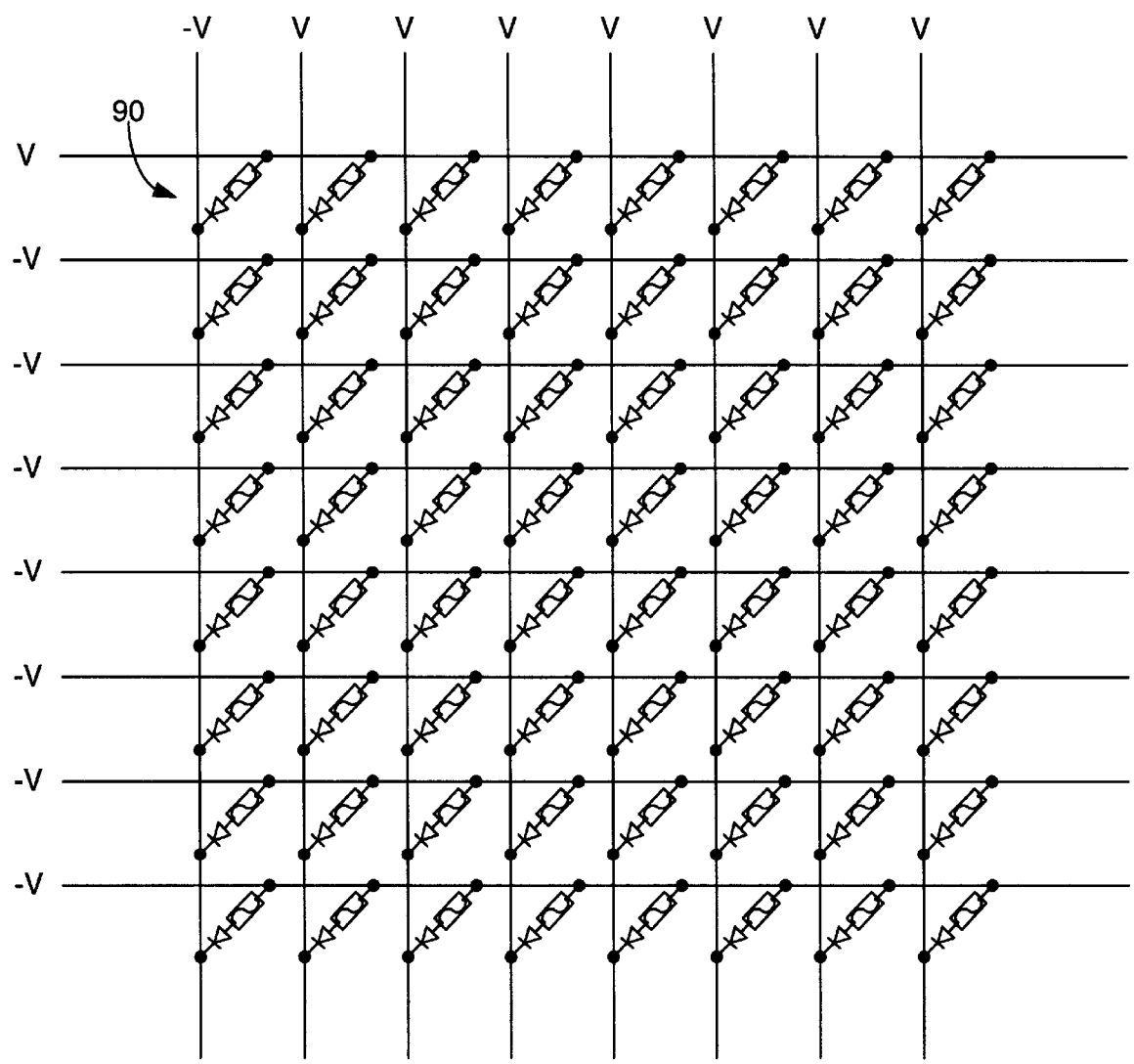
FIG. 6 shows a write-once memory array for illustration of addressing memory elements thereof.

FIG. 6 is a schematic representation of a cross-point write-once diode memory array. The figure shows an eight row by eight column array. If voltages are applied to the row and column electrodes as depicted (i.e. all the column electrodes are a potential V except for one which is at −V, and all the row electrodes are at −V except for one which is at V), then only one diode will be forward biased. For the case depicted in FIG. 6 only the diode (90) in the upper left corner of the array will be forward biased. The diodes in the top row and left-most column will have no bias on them and the remaining diodes in the array will be reverse biased. This constitutes an addressing scheme for the array. If a current flows between the rows and columns with the electrodes at these potentials then the fuse of the upper left diode is intact (e.g. representing a data "0"). Conversely, if no current flows in this configuration then the corresponding diode/fuse has been blown (e.g. representing a data "1"). By modulating the amplitudes of the voltages applied to the array electrodes more current can be made to flow through the selected diode. If this voltage causes a current that exceeds the threshold current of the fuse then the fuse can be blown, changing the state of the memory element. This constitutes a method for writing to the memory.

The actual current required to blow a fuse in the memory array (or the voltage to be applied to achieve that current) should be predictable and controllable at the time of fabrication. Since it is current density through the memory elements that is the operative factor, the applied voltage/current at which an element will blow can be adjusted by varying the junction area of the element. For example, if the cross-sectional area of the intersection of the cross-point electrodes is reduced this also reduces the current/voltage required to be applied to reach the critical current density to blow the fuse. This scheme can be used in the design and fabrication of the memory circuits to ensure that control voltages can be applied to blow only the desired cross-point fuses.

Memory Array Addressing Circuitry

In order to simplify interconnections to the memory module it is desirable to use a multiplexed addressing scheme for accessing the memory elements. In other words, it is desirable that each memory element in a memory array be uniquely addressable from an external circuit through addressing lines that are fewer in number than the total of the array row and column lines. To that end, multiplexing and de-multiplexing circuitry (30) is included on the same substrate as the memory array. Preferably the mux/demux circuits are constructed from a logic family that is compatible with the memory array, so that a simple fabrication process can be maintained. Indeed, as described hereinbelow, it is possible to construct the mux/demux circuits using the same kind of simple devices used in the memory array.

Figure 7:
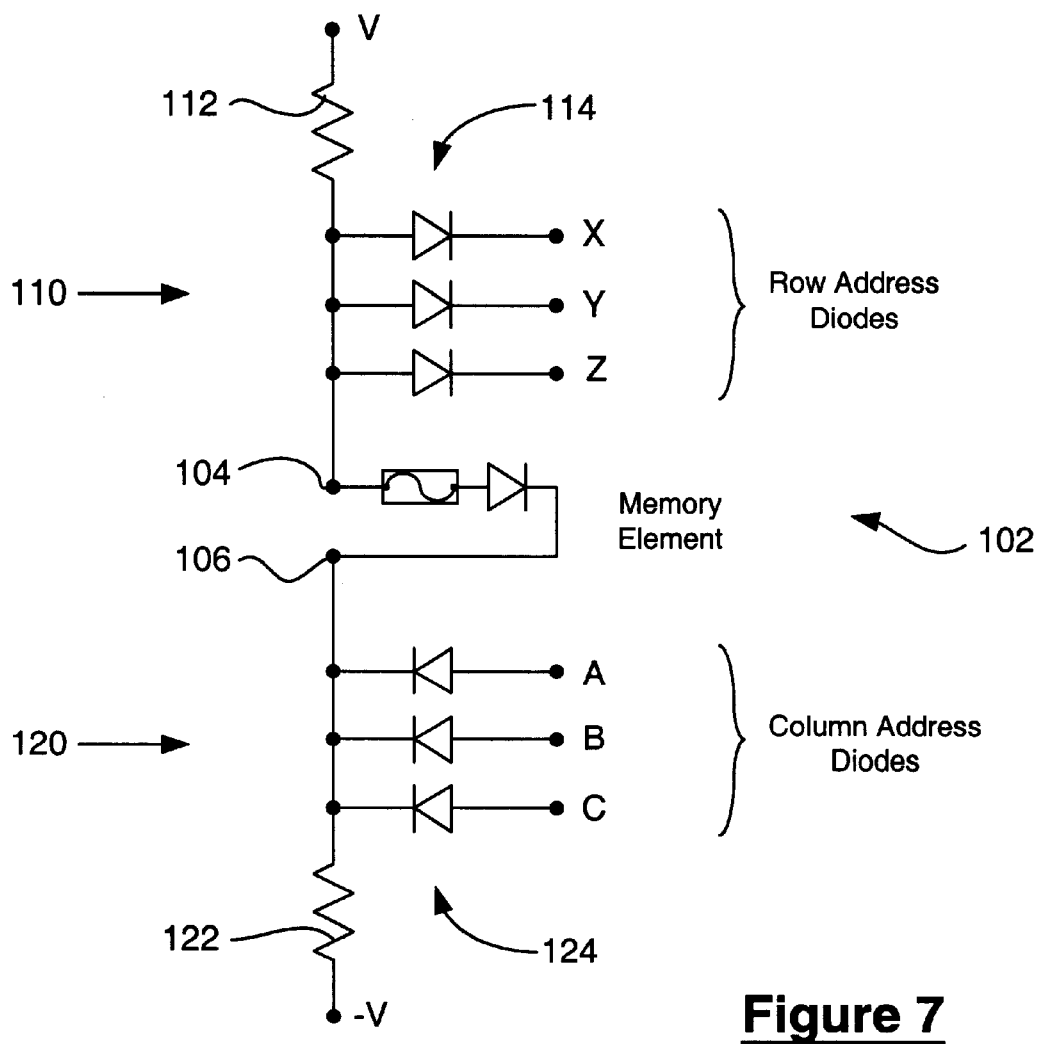
FIG. 7 is a schematic circuit diagram of a portion of a memory array addressing circuit.

In the preferred embodiment, the address mux/demux functions are carried out using a logic scheme referred to as permuted diode logic that is described hereinbelow. FIG. 7 illustrates a single write-once memory element 102 represented by a fuse and diode in series. The memory element 102 is coupled between a row electrode 104 and a column electrode 106. A row address diode logic circuit 110 is coupled to the row electrode 104, and a column address diode logic circuit 120 is coupled to the column electrode 106. The row address circuit 110 as shown comprises a resistive element 112 coupled between the row electrode and a pull-up voltage +V. The row address circuit 110 also comprises plurality of row decode diodes 114 having anodes coupled to the row electrode and cathodes controlled by respective row address input voltages represented by X, Y and Z. A column address diode logic circuit 120 is similarly constructed with a resistive element 122 coupled from the column electrode 106 to a pull-down voltage −V. A plurality of column decode diodes 124 have their cathodes coupled to the column electrode, and anodes controlled by respective column address input voltages represented by A, B and C.

Consider firstly the row address circuit 110 in which logic levels of +V and −(V+ΔV) are used for the row address input voltages (X, Y, Z). It will be apparent that, where voltage +V represents a logic "1", the row address circuit 110 acts like an AND gate with the diode cathodes (X, Y, Z) as inputs and the row electrode 104 as output. The row electrode 104 is high (+V) only if all three row address inputs (X, Y, Z) are high. Similarly, the column address circuit 120 acts like a negative-logic AND gate. In this case, if logic levels of −V and (V+ΔV) are applied at the column address inputs (A, B, C), the output at the column electrode 106 will only be −V when all three inputs are at −V. If the row address inputs (X, Y, Z) all apply cathode voltages of +V to the diodes 114 and the column address inputs (A, B, C) all apply anode voltages of −V to the diodes 124 then the memory element 102 is selected. Although in FIG. 7 only three-input circuits are illustrated, this addressing scheme can be extended to include an arbitrary number of inputs.

Figure 8:
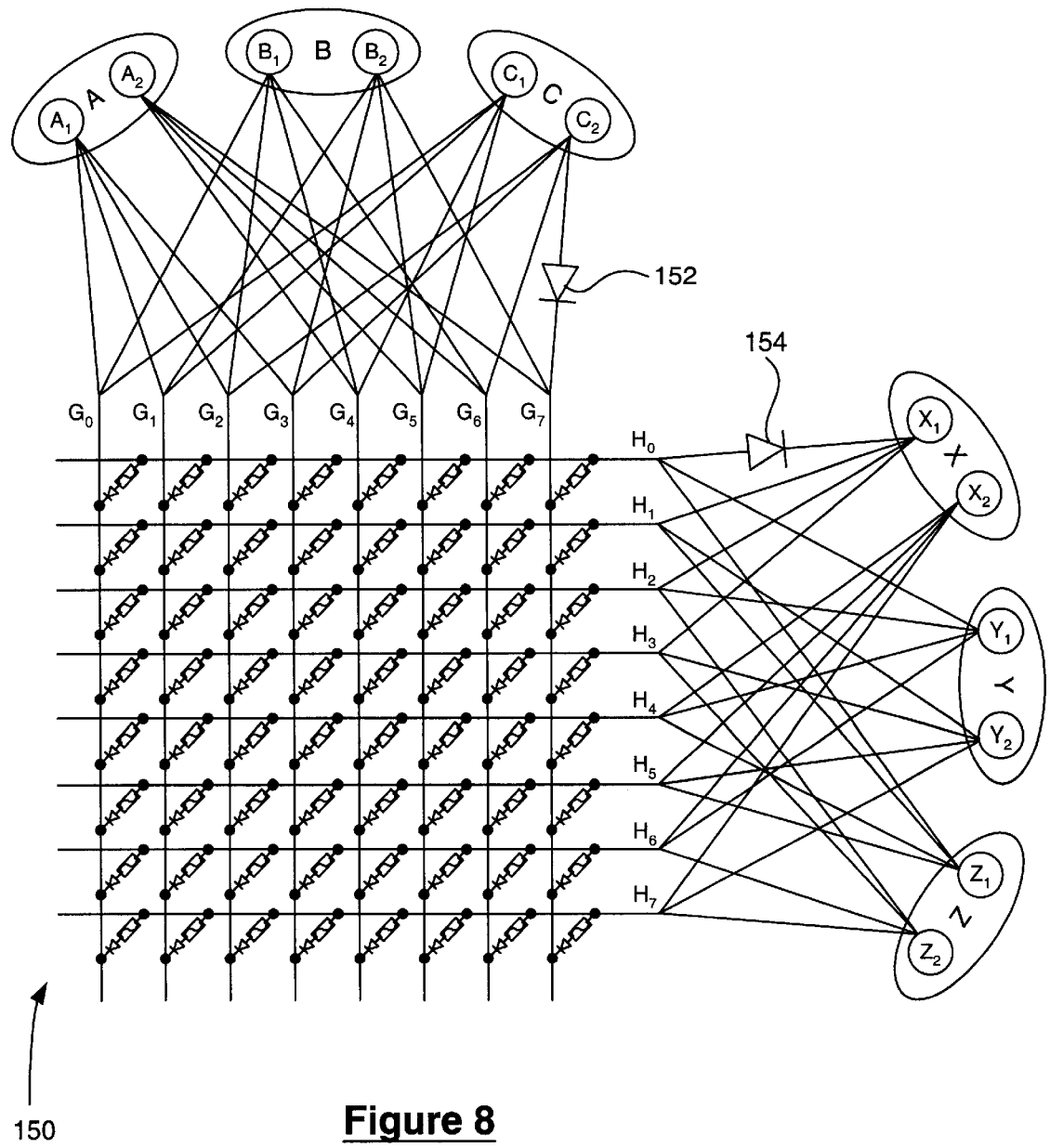
FIG. 8 shows a cross-point memory array with permuted diode logic addressing circuit connections illustrated schematically.

FIG. 8 schematically illustrates an 8×8 write-once memory array 150 having row and column electrodes coupled for addressing memory elements as described above. For reference, the column electrodes of the memory array 150 are labeled $G_0$ to $G_7$, and the row electrodes are labeled $H_0$ to $H_7$. Three addressing groups are provided each of the rows (X, Y, Z) and columns (A, B, C). Each of the addressing groups has two complementary addressing nodes (e.g. $A_1$ and $A_2$), and each node is coupled to four of the eight corresponding row/column electrodes. The connection pattern between the nodes and row/column electrodes is different for each addressing group. In the example of FIG. 8, the connection pattern is as follows:

| $A_1$ | $A_2$ | $B_1$ | $B_2$ | $C_1$ | $C_2$ |
|---|---|---|---|---|---|
| Column Electrode Address Node Connections | | | | | |
| $G_0$ | $G_4$ | $G_0$ | $G_1$ | $G_0$ | $G_2$ |
| $G_1$ | $G_5$ | $G_2$ | $G_3$ | $G_1$ | $G_3$ |
| $G_2$ | $G_6$ | $G_4$ | $G_5$ | $G_4$ | $G_6$ |
| $G_3$ | $G_7$ | $G_6$ | $G_7$ | $G_5$ | $G_7$ |
| Row Electrode Address Node Connections | | | | | |
| $X_1$ | $X_2$ | $Y_1$ | $Y_2$ | $Z_1$ | $Z_2$ |
| $H_0$ | $H_4$ | $H_0$ | $H_1$ | $H_0$ | $H_2$ |
| $H_1$ | $H_5$ | $H_2$ | $H_3$ | $H_1$ | $H_3$ |
| $H_2$ | $H_6$ | $H_4$ | $H_5$ | $H_4$ | $H_6$ |
| $H_3$ | $H_7$ | $H_6$ | $H_7$ | $H_5$ | $H_7$ |

The connections between the column electrodes and column addressing nodes each include a diode coupled as shown at 152, and the connections from row electrodes to row addressing nodes each include a diode coupled as shown at 154. Most of these diodes are not shown in the FIG. 8 diagram so as to avoid unnecessary complication. Although the topology in this example shows the address lines all connected to one end of the electrodes in the array, the address lines may just as easily be connected to either or both ends of the electrode (sides of the array).

The memory array 150 is addressed by applying voltages at the addressing nodes ($A_1$, $A_2$, etc.). An enabling voltage is applied at only one node from each addressing group. This allows a single memory element from the array 150 to be selected, in the manner described above in relation to FIG. 7.

Addressing Over Multiple Memory Module Layers

The above described system for sensing the state of an addressed memory element relies on the addressed diode memory element being the only current path between the row and column electrodes. If parallel addressing is used in the memory module, however, this creates the possibility of more than one conduction path between the row and column address lines, which creates difficulties in using that sensing scheme. Accordingly, an enhanced method and system for detecting the state of an addressed memory element is presented hereinbelow.

As mentioned, the preferred structure of a memory module herein disclosed comprises a stack of multiple layers. Each layer includes a write-once memory array, wherein the memory arrays of the various layers share common addressing lines so as to reduce the number of connections required to external circuitry. Therefore, even though a given address uniquely addresses a memory element in a single array, in a plurality of parallel addressed arrays, multiple memory elements are addressed—one for each layer. This is otherwise desirable for two reasons. First, by being able to read m layers in parallel the read and write rates required to achieve a given serial bit rate are divided by m. Secondly, if separate address lines are required for each layer of the memory then the number of connections from layer to layer and from the memory module to the interface and control circuitry can become unmanageable.

The preferred solution to the parallel addressing difficulty involves including an additional sense diode to each row and/or column electrode at the same node to which the address diodes are connected. The other end of each row sense diode is connected to a common row sense line, and similarly the end of each column sense diode which is not connected to a respective column electrode is connected to a common column sense line. The state of an addressed memory element can be detected from either a row sense diode, a column sense diode, or both. In view of the symmetry of the preferred array construction, it will be appreciated from the description hereinafter that the row and column electrodes are in fact functionally equivalent.

The state of an addressed memory bit is determined by the current which flows through the sense line to a suitably chosen bias point. In order for current to pass through either sense line two conditions must be met: (1) the diode memory element must be addressed, and (2) the fuse of that element must be in the high resistivity state. In all other cases the diode is not addressed and, regardless of the state of the fuse, the corresponding row and/or column sense diode will not be forward biased and will not conduct current. Therefore, if a single sense line is connected to all the row (or column) electrodes and one memory element in the row and column array is addressed, then the state of that memory element can be unambiguously determined.

The use of row and column sense lines provides redundancy without compromising the speed of the readout process and thereby improving the signal detection margin. Note that redundancy can also be added by including additional sense lines to either the row or column electrodes and/or by adding extra diodes in parallel to the connection between the sense lines and the row or column electrodes.

Figure 9:
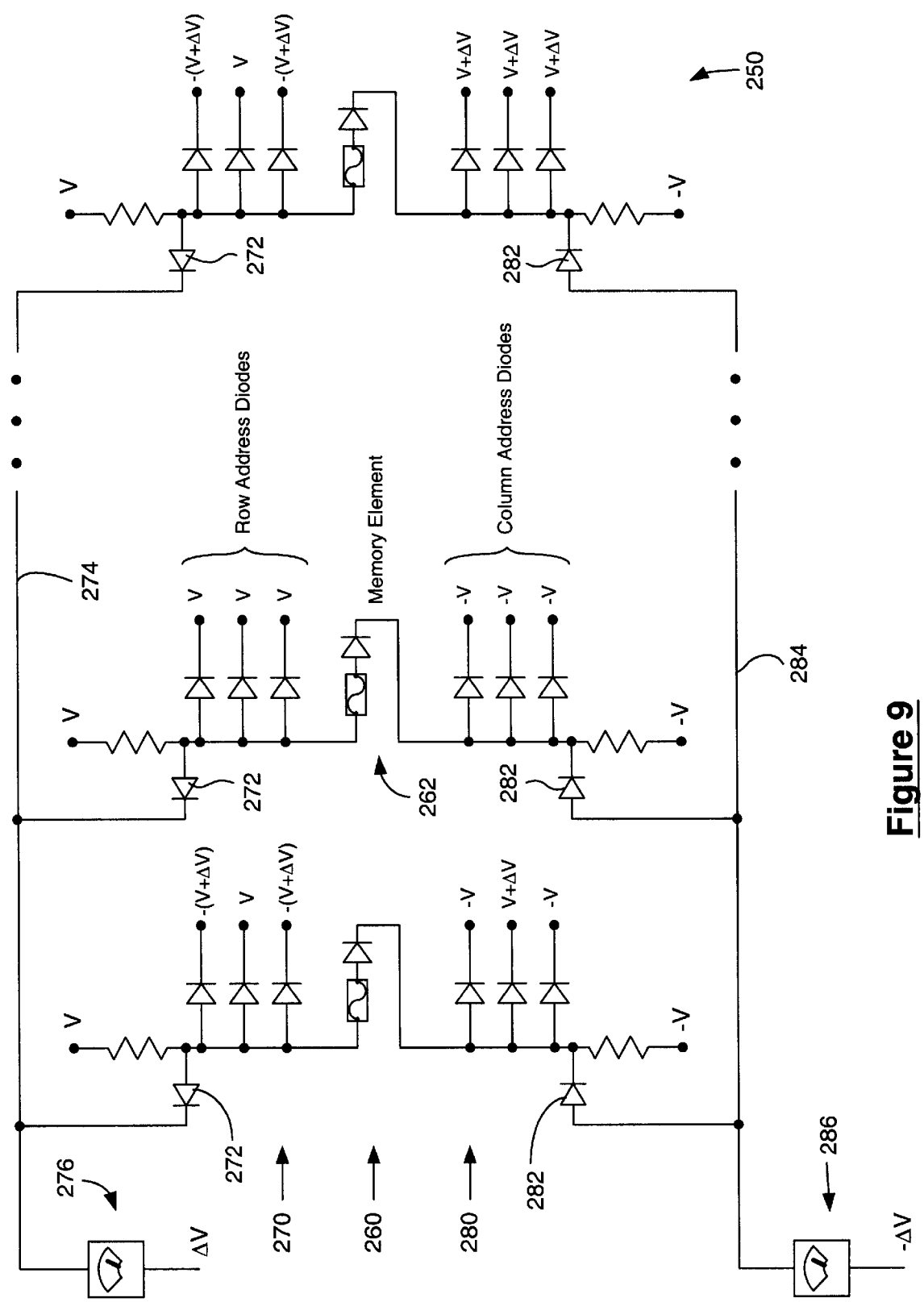
FIG. 9 is a schematic circuit diagram of a permuted diode logic multiplexing/de-multiplexing (mux/demux) and sensing circuit for a memory array.

FIG. 9 shows a schematic diagram of addressing and sensing circuitry 250 utilizing the techniques described above. A plurality of memory elements 260 from a write-once memory array are illustrated, coupled to their respective row and column addressing circuits 270, 280 which are constructed to address the memory array as described hereinabove. The circuitry 250 also includes a common row sense line 274 and a common column sense line 284. The common row sense line 274 is coupled to each of the memory array row electrodes through respective row sense diodes 272. In particular, each diode 272 has its anode coupled to the corresponding row electrode and its cathode coupled to the common row sense line. Similarly, column sense diodes 282 are coupled from the common column sense line 284 to the respective column electrodes of the memory array. The cathodes of diodes 282 are coupled to the respective column electrodes, and the anodes thereof coupled to the common column sense line.

In the example as shown the center memory element (262) is addressed. This is because memory element 262 is the one coupled to both the row and column electrodes that are selected by the addressing circuits. As shown in the Figure, memory element 262 corresponds to the addressing circuits in which none of its row or column address diodes are in conduction due to the voltages applied thereto. If the fuse of memory element 262 is blown then currents will flow through both sense diodes 272, 282 and in both the row and column sense lines 274 and 284. If the center memory element is intact then no currents will flow in either sense line regardless of the state of the fuses in any other memory elements in the array. In that case no current will flow through the sense diodes corresponding to the addressed memory element, and all other memory elements are unselected since the addressing scheme ensures that least one of the address diodes will be in conduction thereby guaranteeing that the corresponding sense diode will be reverse biased.

For the detection scheme described hereinabove, using dedicated sense diodes, the leakage of the individual data diodes is not particularly important from a detection viewpoint, what matters more is the leakage currents of the inactive sense diodes on the active sense line. Since, for an array of N elements there will be only sqrt(N) sense diodes on each sense line, a modest number of power supply stripes can reduce this problem to an easily manageable one, especially for diodes with rectification ratios of around $10^6$.

Addressing Circuitry Fabrication

The cross-point diode array consists of a substrate material on which a patterned metal layer is deposited. This layer is the row or column electrode layer. Next the semiconductor layer is applied. Ideally this layer is formed from a material that does not need to be patterned, however depending on the diode spacing, film thickness and material properties patterning may be required. For the purposes of the following description it will be assumed that patterning of the semiconductor layer is not required. Finally, a second patterned metal layer that creates an orthogonal set of electrodes to those in the first metal layer is applied. Such a structure is shown in the previously described memory array unit cell of FIG. 5.

The preferred embodiment of the present invention enables the multiplexing and sensing schemes described hereinabove to be fabricated with virtually the same process as that required for the cross-point diode array. In particular, a significant aspect of the sensing and multiplexing schemes from a fabrication viewpoint is that they can be implemented by using the sense and addressing diodes as vias. Conventional two-level interconnect requires a dielectric material between the two metal layers which must be patterned and processed to form conducting vias through it. Such a process requires accurate alignment of both metal layers and the dielectric. By using the sense and address diodes as vias preferred implementations of the present invention avoid the need for dielectrics to be included in the process, and a relaxation of alignment tolerances is achieved.

Figure 10:
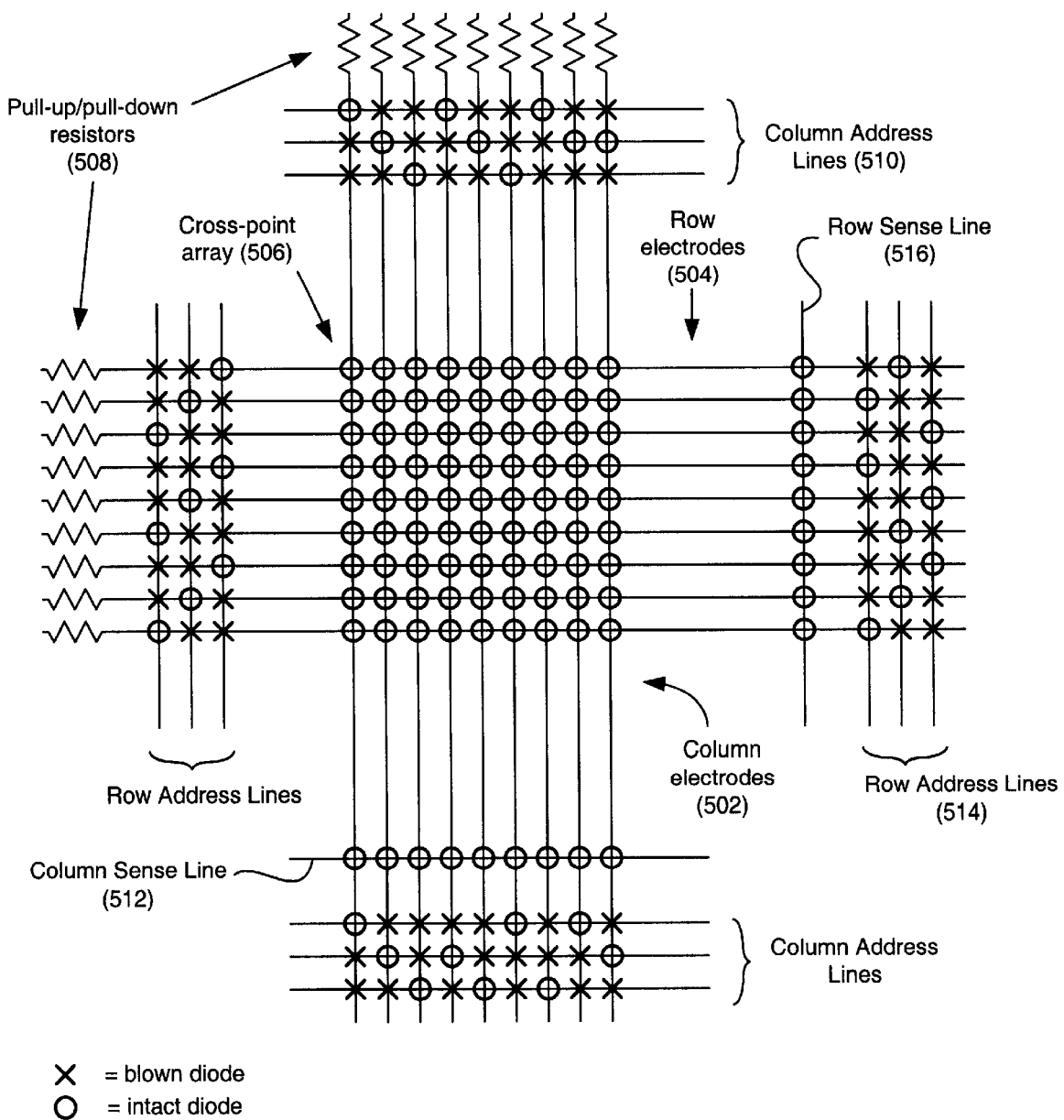
FIG. 10 is a diagrammatic layout view of a cross-point memory array and associated addressing and sensing circuit elements.

FIG. 10 is a diagrammatic layout diagram of a cross-point memory array with addressing and sensing circuitry of the form described above. The simplified diagram illustrates the row electrodes, column electrodes, row sense line, column sense line, row address lines, and column address lines for a 9×9 cross-point diode array, with 2nd order addressing. As shown, column electrodes 502 and row electrodes 504 are orthogonal to one another and formed on respective layers separated by a semiconductor layer. Diodes are formed at the intersections of the electrodes, creating the cross-point diode memory array 506. Each cross-point diodes can be transformed from a normal conducting state to a "blown" high-impedance or open circuit state, and that is the method used to write data to the memory array. To transform the diode from the conducting state to the open state a current is passed through the diode in the forward biased direction exceeding a certain critical current density. In the Figure, diode elements that are intact are indicated by an "O" at the respective intersection, and diodes elements that are blown are indicated by an "X". The cross-point memory array as shown has no data stored in it and thus all of the diodes therein are intact.

Preferably it is the width of the row or column electrode that is modulated, rather than the address line, for practical reasons related to alignment. If the address line width is modulated then the modulation must be performed over the pitch of the row/column lines so that two adjacent diodes are not unintentionally blown. Modulating the width of the data lines can be done over a relatively large distance giving the freedom of relaxed alignment tolerances. Also, extending alternate row/column lines out from opposite sides of the matrix allows the width modulation to be doubled which helps add margin to the programming process. Furthermore, by choosing a particular arrangement of connections it can be guaranteed that no two consecutive lines extending from either side of the array will both be widened, this further increasing the margin for programming. Finally, the address and sense lines will be wider than the other row and column traces because they need to carry more current without failing during operations like addressing while writing, and the address programming operation. They can also be spaced further apart to reduce alignment tolerances.

The row and column electrodes extend out from the cross-point array and are terminated at their ends by pull-up/pull-down resistors 508 (corresponding to resistors 112, 122 in FIG. 7). Crossing the column electrodes between the memory array and the terminating resistors are a plurality of column address lines 510 and at least one column sense line 512. The column address lines and column sense line(s) are formed on the same conductor layer as the row electrodes so that where they cross the column electrodes diode junctions are formed therebetween. The diode elements formed by the column sense line corresponds to diodes 282 in FIG. 9, and the diodes formed by the column address lines correspond to diodes 280 in FIG. 9. The address line group/node arrangement described above is formed by blowing selected ones of the column address line elements, leaving intact the desired diode connections (or in the case of anti-fuses, forming selective connections and leaving others in the high impedance state). This programming of the addressing circuitry can be finalized after fabrication of the circuits, as outlined below.

The row electrodes 504 are similarly crossed by row address lines 514 and a row sense line 516. The row address lines and row sense line are formed on the same conductor layer as the column electrodes, creating row address diodes (e.g. 270 in FIG. 9) and row sense diodes (e.g. 272 in FIG. 9).

At the time of fabrication, diode junctions are formed between each of the column address lines and each of the column electrodes, and between each of the row address lines and each of the row electrodes. However, in order to implement the group/node addressing scheme described above, it is necessary that only selected diode connections be maintained between addressing lines and array electrodes. The "programming" of the selected connections can be finalized after the circuit fabrication by blowing certain address diodes leaving only the selected diode connections intact.

Another aspect of the electrode width modulation is that all of the address diodes (and sense diodes) must be able to withstand currents that can blow the data diodes. This condition happens to the address diodes on unaddressed row or column electrodes in a stripe where a diode is being written. Those diodes shunt the same current that is being used to write to the selected data diode. Accordingly, all of the address and sense diodes must be larger than the data diodes but that some are even larger for the programming operation to function as described.

As fabricated all the address diodes are connected in parallel to the row/column electrodes. If all the diodes are identical, when a common potential is applied between the row/column electrodes and the address lines a similar current will flow through each diode. However, if the diodes have various effective areas, then although they will still carry approximately the same current, they will have different current densities. In this situation there will exist a current that will exceed the critical current density of some diodes, causing them to blow, but leave other diodes intact. This property is exploited as described below so that the address network can be programmed. Advantageously, the preferred implementation of the present invention not only provides a method for establishing the appropriate connections between the address diodes, sense diodes, and the row and column electrodes, but also ensures that the anodes and cathodes of the diodes are properly orientated to implement the diode logic functions described hereinabove.

Figure 11:
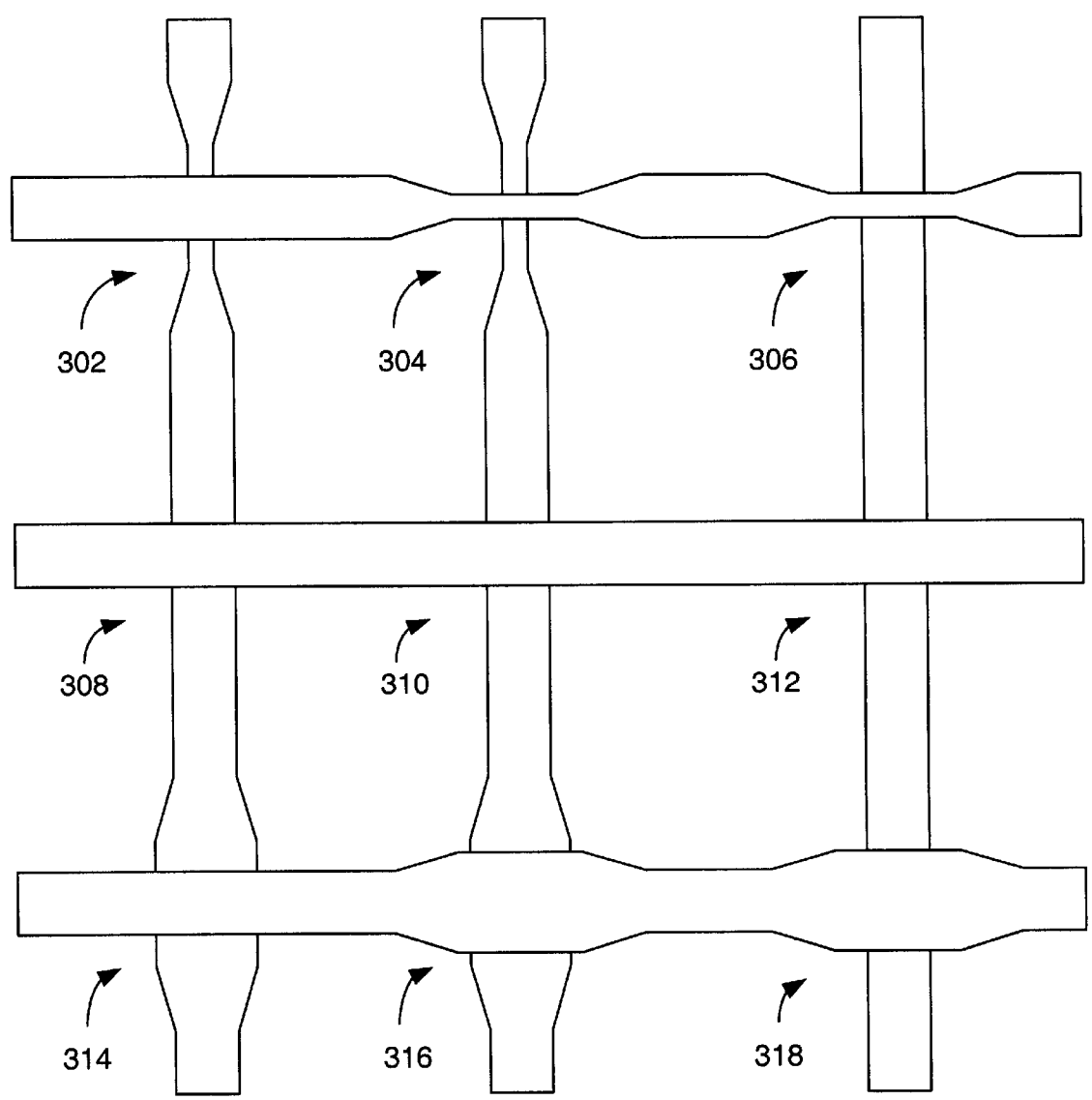
FIG. 11 illustrates various configurations of orthogonal electrode intersections.

FIG. 11 illustrates various configurations of orthogonal electrode intersections, showing ways in which the widths of the orthogonal electrodes can be varied in order to change the effective area of a diode formed at their intersection. The semiconducting layer that would separate the vertical and horizontal electrodes in practice is not shown in this Figure. The center row of intersections 308, 310, 312 all have nominal intersection areas in so far as the electrodes thereat are neither narrowed in width nor widened. These electrode intersections would result in nominally normal sized diodes in the integrated circuit. The upper row of electrode intersections 302, 304, 306 all have narrowed electrode sections at the intersections. In particular, intersection 302 has a narrowed vertical electrode section, intersection 306 has a narrowed horizontal electrode section and intersection 304 is narrowed in both the vertical and horizontal electrodes. These electrode intersections would result in relatively small diodes in the integrated circuit. In the smaller diodes, the reduced anode and/or cathode area results in a reduced cross-sectional area of semiconductor layer between the electrodes. This means that a smaller current through the diode can cause the diode to reach the critical current density at which the diode will blow and become non-conducting. Intersections 314, 316, 318, on the other hand each have widened anode and/or cathode electrode areas, meaning that diodes formed thereby could carry larger than normal current without reaching the critical current density. It may be desirable for reasons other than programming to have some diodes with larger areas than others. For example, address and sense diodes might be larger to improve their robustness or fabrication yield.

It will be recognized that the actual critical current density required to blow a given cross-point diode will depend upon several factors, not only the size of the anode and cathode at the intersection. The material used for the semiconductor layer(s) and the thickness of the layer, for example, will also affect what current density is required to blow a given diode. However, given relative consistency of the semiconductor material characteristics and layer thickness over the integrated circuit area, the sizes of the diode electrode areas can be used to govern the current level through a diode necessary for breakdown relative to other diodes with different electrode areas.

FIG. 12 shows a configuration of integrated circuit conductors from the two layers, illustrating why it may be particularly advantageous to only vary the width of one of the orthogonal electrodes in order to change the effective area of diodes. The upper portion of the Figure shows the intersection of two row electrodes and two column electrodes. The row electrodes are also intersected by a pair of row address lines, and the column electrodes intersected by a pair of column address lines. The column electrodes and row address lines extend vertically in the diagram, and are formed on the first conductor fabrication layer. The row electrodes and column address lines extend horizontally and are formed on the second conductor fabrication layer. The lower portion of the Figure shows the same conductor configuration with the horizontal conductors slightly skewed with respect to the vertical electrodes, as can occur during fabrication.

The pitch of the row and column electrodes would typically be chosen as the minimum that can be supported by the fabrication lithography process or the like, so as to obtain the greatest memory array density. However, the pitch of the address lines can be relatively large, since there are few of them, without significantly effecting the storage density. The construction strategy illustrated in FIG. 12 involves uniform width address lines spaced with a relatively large pitch (compared to the row and column pitch). Then, by modulating the width of the row and column electrodes over lengths comparable to the address line pitch, the required alignment between the row and column layers in both translation and rotation, can be greatly diminished. As shown in the lower portion of the Figure, the cross-point portions of the devices formed by this technique are nearly insensitive to misalignment, and the sensitivity of the address lines to misalignment can be diminished in inverse proportion to the address line pitch.

Figure 13:
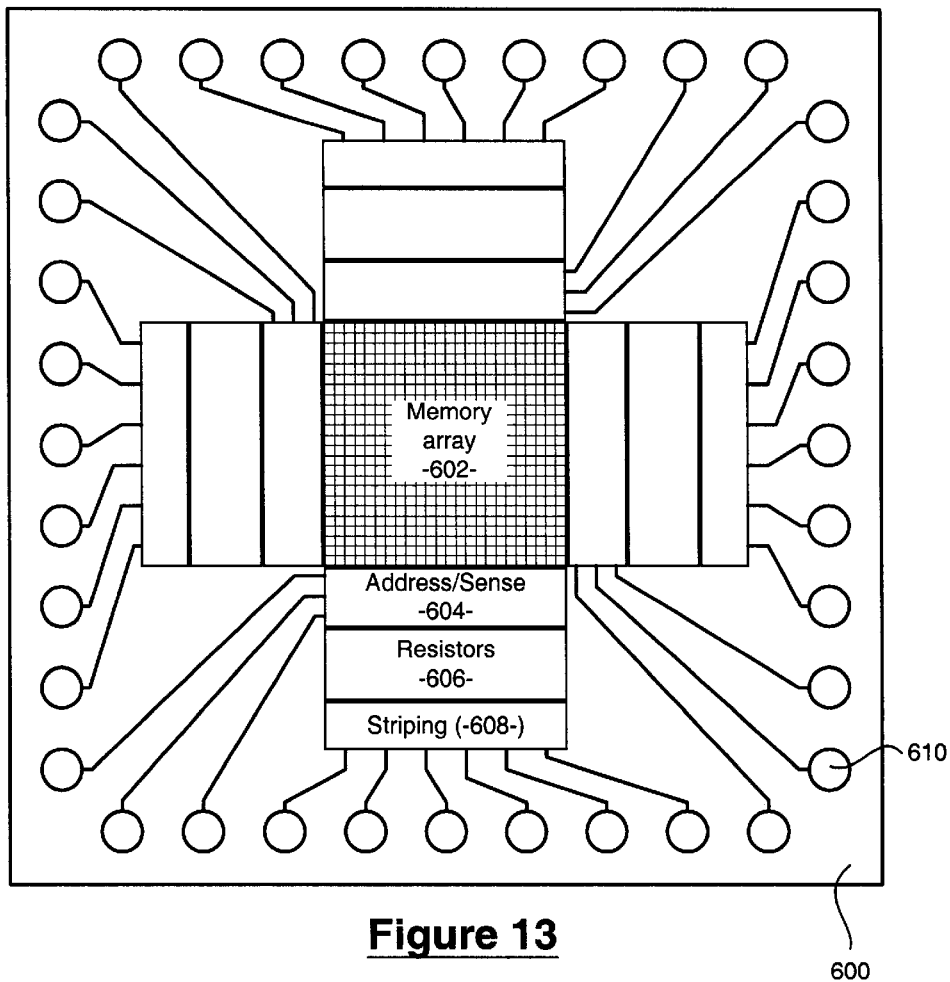
FIG. 13 is a simplified block architectural layout diagram of a memory module layer.

FIG. 13 illustrates a block architectural layout of a memory module layer 600 indicating an example of the relative positioning of the circuit components. The memory array 602 is positioned centrally, and at the periphery thereof are positioned address/sense lines 604, pull-up/pull-down resistors 606 and power supply striping couplings 608. Around the periphery of these circuits are located contact pads 610 for making external interconnections. It will be appreciated from the foregoing description that the physical architecture of the layer 600 is particularly simple, with the row/column electrodes extending out from the array through the address/sense circuits, resistors and striping connections to the interconnect contact pads. The address and sense lines are similarly arranged, and all of the diode circuit elements are automatically formed at the conductor cross-points (with certain diodes being later blown in programming as described above). It should be recognized that the drawings depicting the memory module layer are not to scale, and although the addressing sensing and striping circuitry is enlarged in the figures such circuitry would typically comprise only about 5–10% of the layer area.

Figure 14:
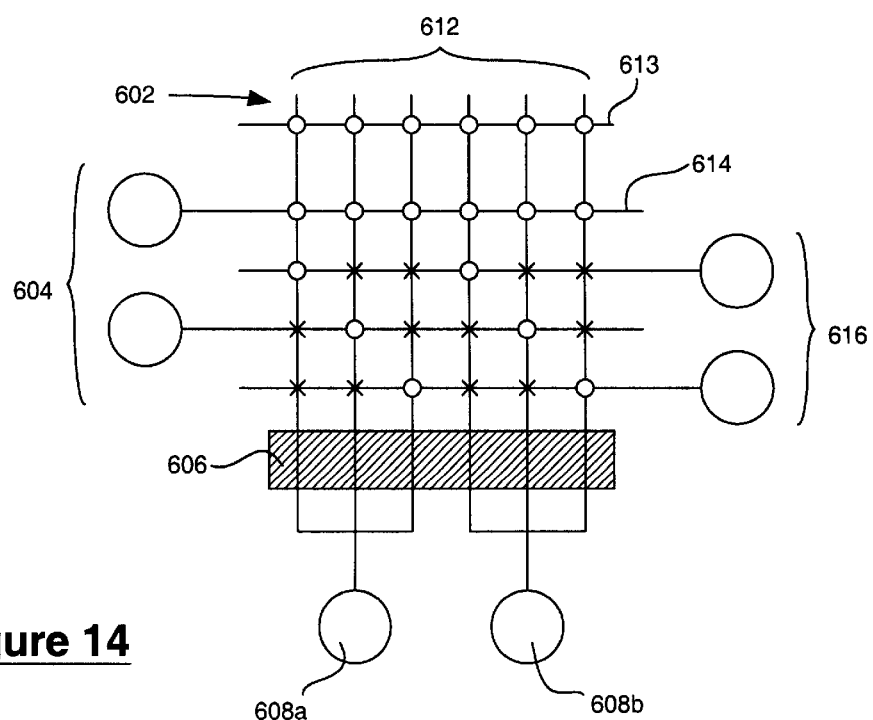
FIG. 14 is a diagrammatic layout view of a portion of memory array and addressing/sensing circuitry.

A portion of the memory module layer layout is shown in greater detail in FIG. 14. Here, a portion of a memory array 602 is shown with column electrodes 612 and row electrode 613. The column electrodes are crossed by a column sense line 614 and column address lines 616, forming the address/sense circuits 604. Pull-up/pull-down resistors are formed in the column electrodes at 606. The column electrodes are arranged into stripes, wherein groups of electrodes are coupled to separate power supply terminals 608*a*, 608*b*. The row electrodes (not shown) are similarly arranged. The power supply striping connections can be used as part of the addressing scheme as well as a mechanism to reduce leakage currents, by applying power to, and thereby selecting, only one portion (sub-array) of the memory array at a time.

Assuming that the address and power supply lines are bussed (common) to all of the layers in a memory module, writing data can be performed by addressing a bit on each layer and strobing the power supply in the active sub-array (determined by the power supply striping) from a read level to a write level. However, it must be possible to write different data states to different layers, and this can be achieved using the sense lines to pull down the voltage on layers where the memory element diode/fuse is to be protected. This means that the sense diodes must withstand a current that would blow the memory array elements. Accordingly, the sense diodes are fabricated with enlarged cross-sectional areas so as to reduce current density therethrough.

Integrated Circuit Structure

Referring again to FIG. 3, the physical structure of the memory module 20 will be described. As mentioned, the preferred form of the memory module 20 has a plurality of stacked layers 22, each having a memory array formed on a plastic (polymer) substrate 50. Although it is not essential that a polymer material be used as a substrate, this is preferred because the materials can be produced and processed at relatively low cost. The substrate 50 may be formed from a variety of commercially available polymer materials, preferably in the form of a thin sheet material. A non-limiting list of exemplary polymer materials that may be used as a substrate 50 includes: polyimides, such as Kapton™ available from DuPont; polyethersulphone (PES); polyacrylate (PAR); polyetherimide (PEI), such as Ultem™ film available from General Electric; polyethylene napthalate (PEN); polyethylene terephthalate (PET); polyester terephthalate, such as Mylar™ available from DuPont; polytetrafluoroethylene (PTFE), such as Teflon™ available from DuPont; polycarbonate, such as Lexan™ available from General Electric; polyvinyl chloride (PVC); polyester films such as Melinex™ available from Orica; and other such polyester films and polymer films known for use in the art of forming circuits on plastic substrates. The substrate is preferably thin to permit flexible "roll-to-roll" processing, such as of the order of 0.01 mm to 0.05 mm in thickness.

The memory array 25 and addressing circuitry 30 can be formed according to a metal-semiconductor-metal (MSM) process on the plastic substrate 50. The MSM process results in two patterned layers of conductive metal circuits with one or more layers of semiconductor material therebetween. Where the metal layers cross and make contact to opposed sides of the semiconductor layer, a diode junction is formed between the metal layers. The production of MSM diode integrated circuits is described, for example, in the specification of International Patent Application Publication Number WO 99/39394, entitled "X-Y Addressable Electric Microswitch Arrays and Sensor Matrices Employing Them". The disclosure of that document is explicitly incorporated herein by reference.

There are many different materials that may be used for the semiconductor layer of the memory module circuits, some of which are disclosed in the aforementioned publication. Organic and inorganic materials may be used for the semiconductor layer. Inorganic materials include amorphous silicon and germanium materials, for example, and the use of such materials in similar applications is known in the field of photovoltaic cells. Inorganic semiconductor materials may be preferred, however, because of their ability to be processed at lower temperatures that are more compatible with formation on a plastic substrate. Other possible benefits of organic materials in this application are: i) electronic behavior that can be modified by changing the chemistry, ii) highly anisotropic bulk conductivity that may remove any need for patterning of semiconductor films in order to avoid element-to-element crosstalk, and iii) the possibility of using the semiconductor as a conductive adhesive to assemble the crosspoint structure. For example, a polyimide substrate material may be able to withstand processing at temperatures up to about 300 degrees Centigrade, however other possible substrate materials such as PEN and PET are limited to maximum processing temperatures of about 130–150 degrees C. Thus, the choice of semiconductor material for a given application may depend upon the selected substrate material. In general, a semiconductor material that can be processed (e.g. deposited and patterned, if necessary) at a temperature of less than about 150 degrees C. will be compatible with most suitable substrates.

Examples of organic materials that may be employed as semiconductor layers in the memory module include a bi-layer consisting of copper pthalocyanine (CuPc) with PTBCI (3,4,9,10-perylenetetracarbonxilic-bisbenzimidazole). Other candidate materials that may be used in conjunction with CuPc are: PTCDA (3,4,9,10-perylenetetracarboxilic danhydride); and BTQBT [(1,2,5-thiadiazolo)-p-quinobis(1,3-dithiole)]. Layers can also be made from: TPD (N,N'-diphenyl-N,N'-bis(3-methylphenyl) 1-1'biphenyl-4,4'-diamine); α-NPD (4,4'-bis[N-(1-napthyl)-N-phenyl-amino]biphenyl); and TPP (5,10,15,20-tetraphenyl-21H,23H-porphine). Other materials may also be employed for the purposes of the present invention, as will be apparent to those skilled in the art.

Figure 15:
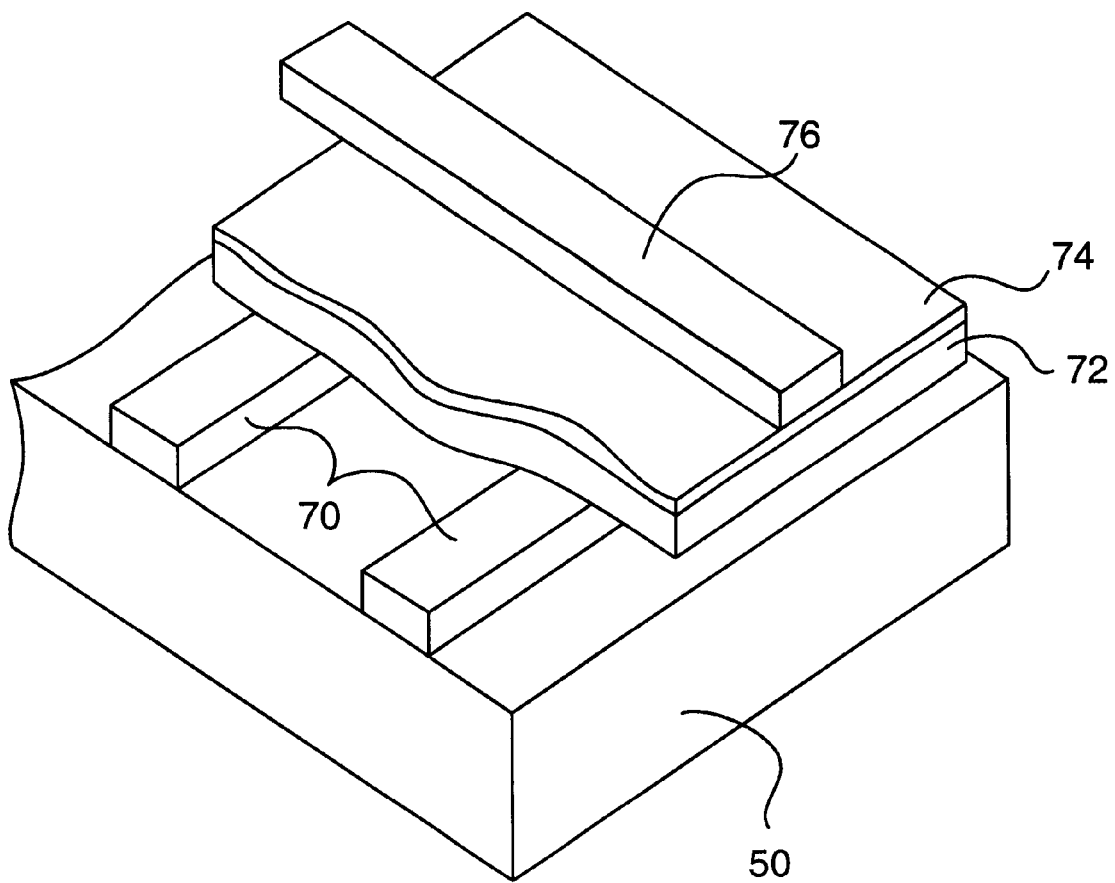
FIG. 15 is a cut-away isometric view of a memory module layer structure for use in an embodiment of the invention.

FIG. 15 is a simplified isometric diagram of a portion of a memory module circuit illustrating the general structure thereof. A pair of electrode conductors 70 are shown formed on the substrate 50 from a first metal layer. Two layers of semiconductor material 72, 74 are formed on the first metal layer. A conductor 76 extending transversely of the conductors 70 is formed from a second metal layer that overlays the semiconductor layers 72, 74. Where the semiconductor material is sandwiched between the conductors 70 and 76 of the first and second metal layers, diode elements are formed. In FIG. 15 the semiconductor layer as illustrated is continuous, however if the semiconductor material used has a low bulk resistivity relative to the thickness of the films such that the lateral leakage currents can be appreciable relative to the intended current through the films at the intersection of the electrodes, patterning of the semiconductor layer may be required.

Preferably diodes formed by the semiconductor layer(s) in the memory array act as both the diode (e.g. 66 in FIG. 4) and the fuse (64) of the memory elements. In this case the semiconductor layer(s) must perform the function of a fuse in that, under predetermined conditions, the diode junction characteristics change irrevocably to a high impedance state. For example, during a memory write operation a current density through the diode which is above a certain current density threshold may be used to break down the diode and alter the conduction characteristic thereof to a high impedance. An example of an electrode/semiconductor/electrode layered structure that can function in this way is:
(2000 Å)Au/(800 Å)CuPc/(800 Å)PTCB/(200 Å)BCP/(3600 Å)Ag
where CuPc is copper pthalocyanine, PTCB is 3,4,9,10-perylenetetracarbonxilic-bis-benimidazole, and BPC is bathocuproine.

Alternatively, the memory array may be constructed to operate in the opposite manner with "anti-fuse" elements, wherein the memory elements are fabricated in a high impedance state and can be written to to induce a low impedance condition. For example, a doped (e.g. $p^+$-n-i or $n^+$-p-i) amorphous silicon layer structure can be employed as the semiconductor layer, which may allow memory elements to in fact be erased or re-written if desired. Such structures are described, for example, in P. G. Lecomber, et al., "The Switching Mechanism in Amorphous Silicon Junctions", (Journal of Non-Crystalline Solids 77 & 78 (1985) pp1373–1382), and U.S. Pat. No. 4,684,972 entitled "Non-volatile Amorphous Semiconductor Memory Device Utilizing a Forming Voltage". The disclosures of those documents are hereby expressly incorporated herein by reference.

Layer Fabrication Process

Each layer of the memory module is advantageously constructed using a fast and inexpensive process to aid in achieving a low cost product. The use of a thin web substrate of flexible polymeric or metal (with dielectric film) material enables a relatively inexpensive roll-to-roll fabrication process to be employed, for example.

A web-processing technique referred to as emboss and lift-off described hereinbelow was originally developed for manufacturing a unique silver halide based photographic film at Polaroid™. The technology can be advantageously applied to producing the row and column electrodes for the cross-point memory array and address/sense lines since it has the ability to produce sub-micron sized features on plastic webs in an economical roll-to-roll process. An example of a micro-embossing process is described in U.S. Pat. No. 6,007,888 entitled "Directed Energy Assisted in Vacuo Micro Embossing", the disclosure of which is incorporated herein by reference. Alternatively, a conventional lithographic process may be used although currently the minimum feature size capability of such a process is limited to about 25 microns in a production environment.

Figure 16:
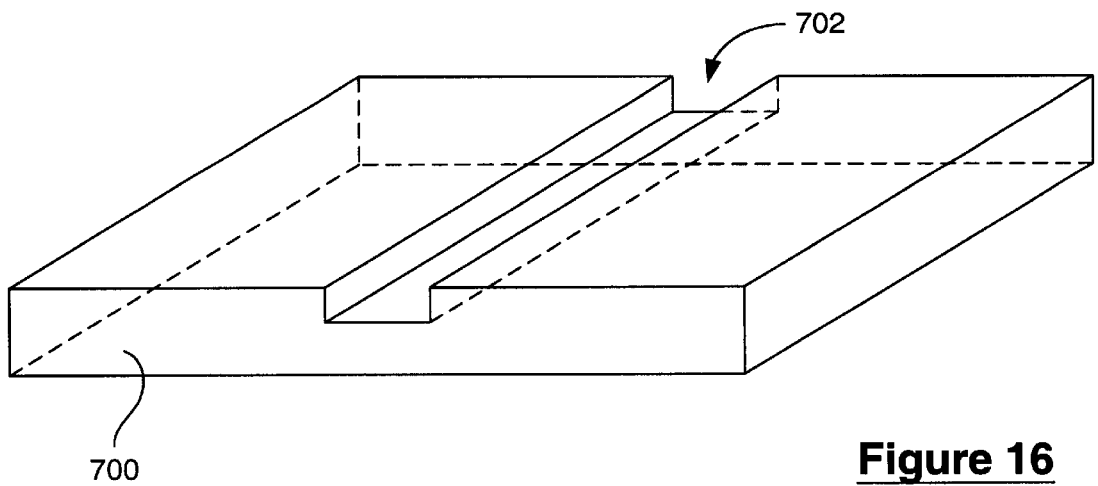
FIGS. 16 to 22 illustrate stages in an exemplary emboss/lift-off layer fabrication process.

The emboss lift/off process is illustrated in steps in FIGS. 16 to 22 which are referred to hereinbelow. The process begins with a plastic web 700 (FIG. 16) having a thickness as little as 10 microns. The first step in the process is to emboss this substrate with a pattern of micron scale features. The embossing is performed by a roll which has had features defined on its surface through a conventional high resolution lithographic process similar to that used to generate masters for the CD-ROM injection molding process. FIG. 16 shows a portion of the plastic substrate 700 after it has been embossed, illustrating an embossed feature groove 702. The pattern embossed onto the substrate corresponds, for example, to one conductor layer of a memory array and address/sense line circuit.

Figure 17:
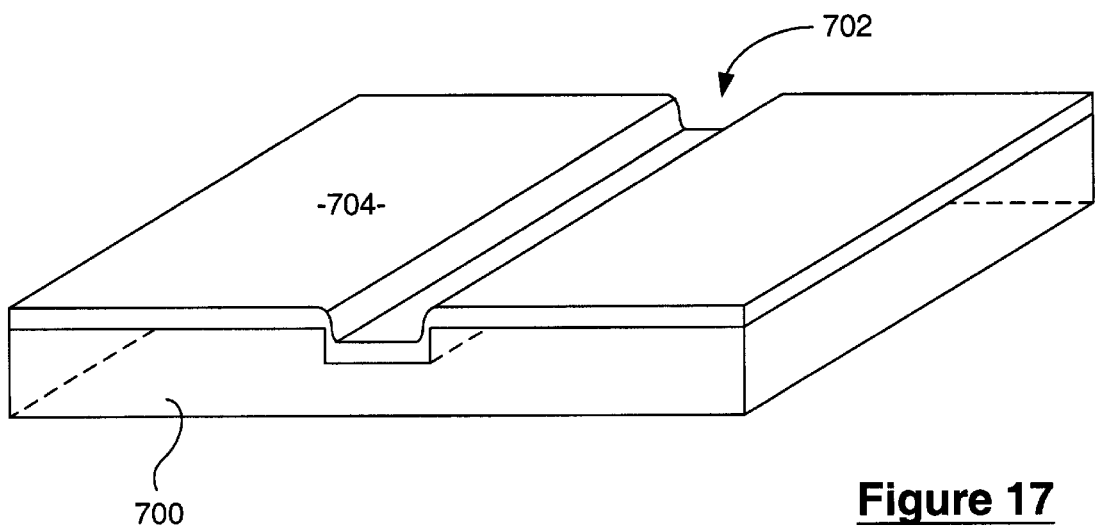

The web 700 is coated with a conductor (e.g. metal) material 704 using evaporation, sputtering, vapor deposition or the like. The coating may comprise a single thin film or several films forming a stack. The total deposited film thickness is less than the depth of the embossed features (702). FIG. 17 shows the web 700 after deposition with the conductor coating 704 covering the surface thereof into the embossed features 702. The nature of the deposition process results in non-uniform coating of the plastic, wherein the side walls of the embossed features have a thinner coating than the surfaces parallel to the face of the web. This is important for the lift-off step that follows.

Figure 18:
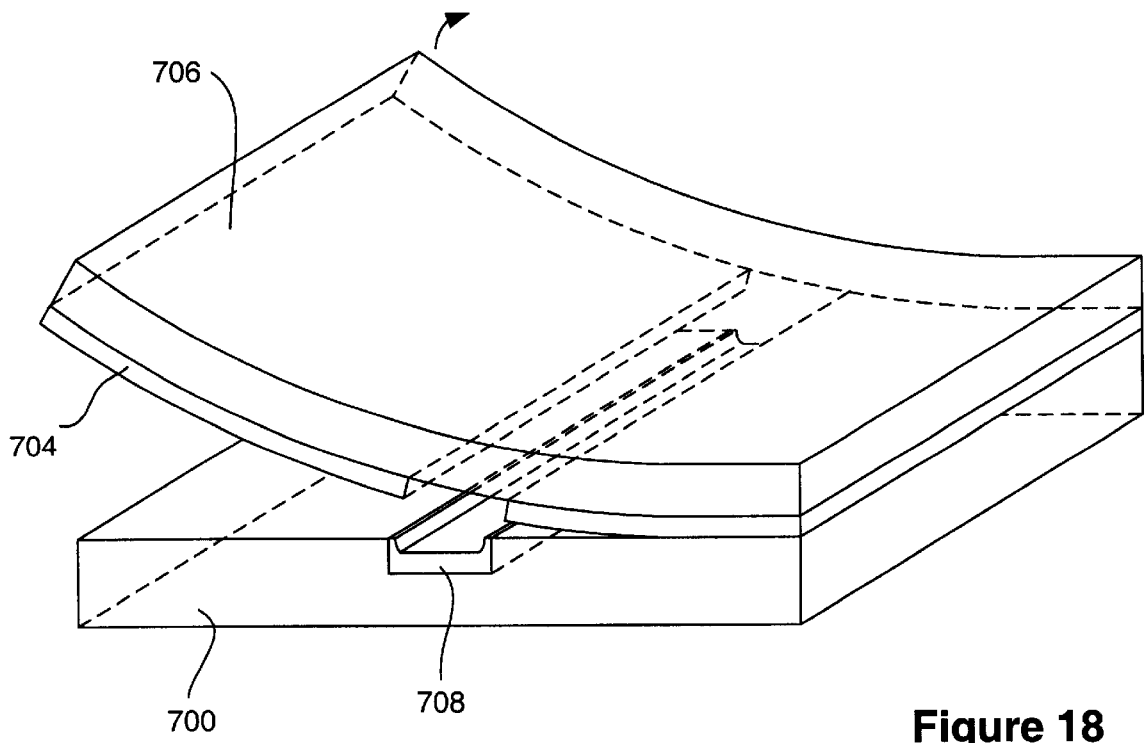

In the lift-off step a second plastic film 706 coated with a pressure sensitive adhesive (not shown) is brought into contact with the coated surface of the first web 700. The second film sticks to the coating 704 at all points except for where the coating is recessed in the embossed features 702. The second film is then stripped off, as illustrated in FIG. 18, removing the coating 704 from the first substrate except for portions 708 thereof recessed in the embossed regions. This process relies on two factors. The first factor is that the pressure sensitive adhesive forms a stronger bond to the coating 704 than the coating forms with the surface of film 700 on which it is deposited. The second factor is the requirement that the conductor material coating is thin enough on the side-walls of the embossed features so that these regions fracture instead of pulling the coating portions 708 out from the embossed recesses 702.

Figure 19:
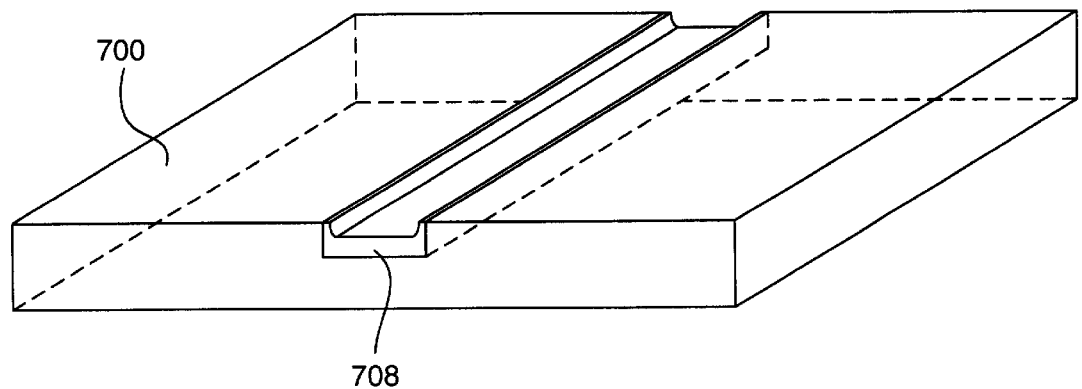
Figure 20:
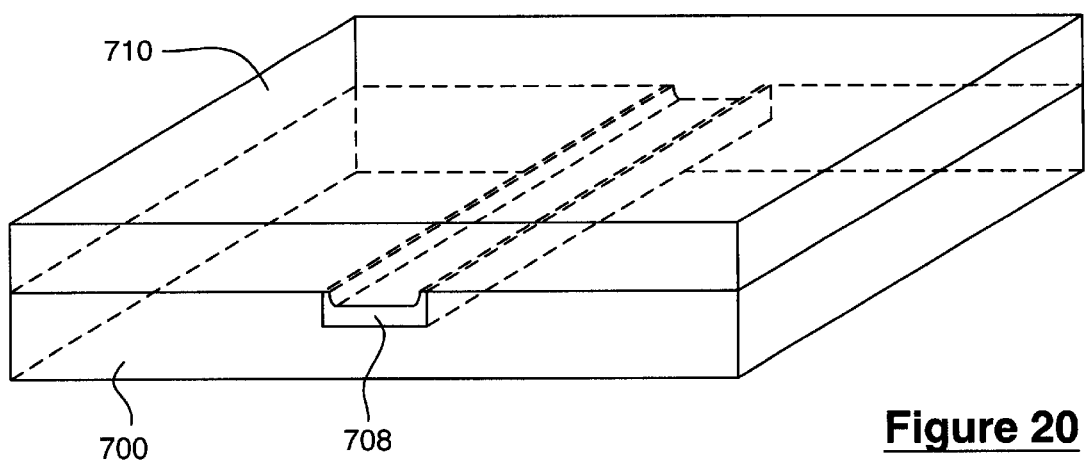
Figure 21:
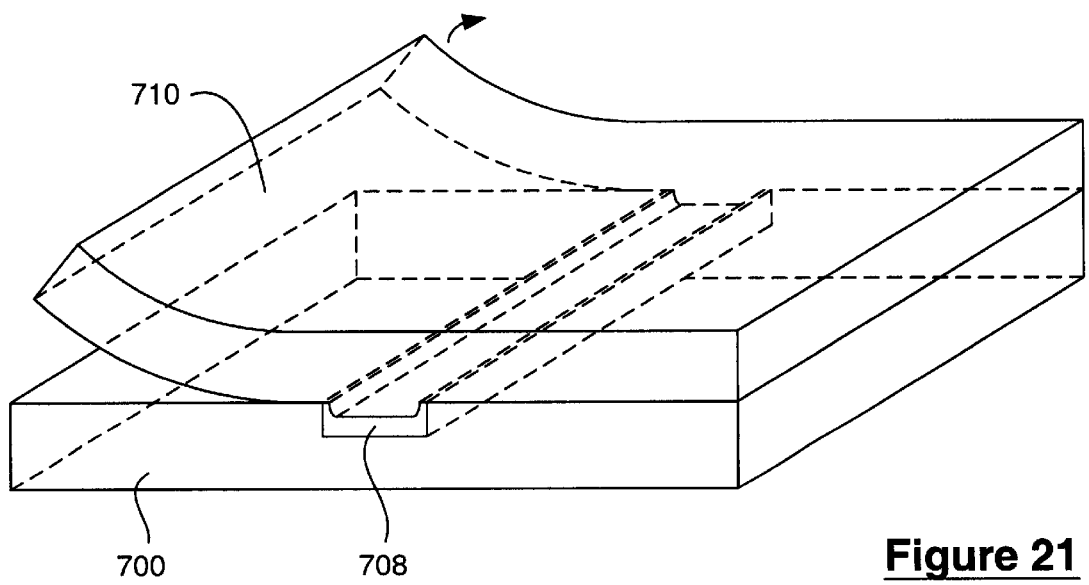
Figure 22:
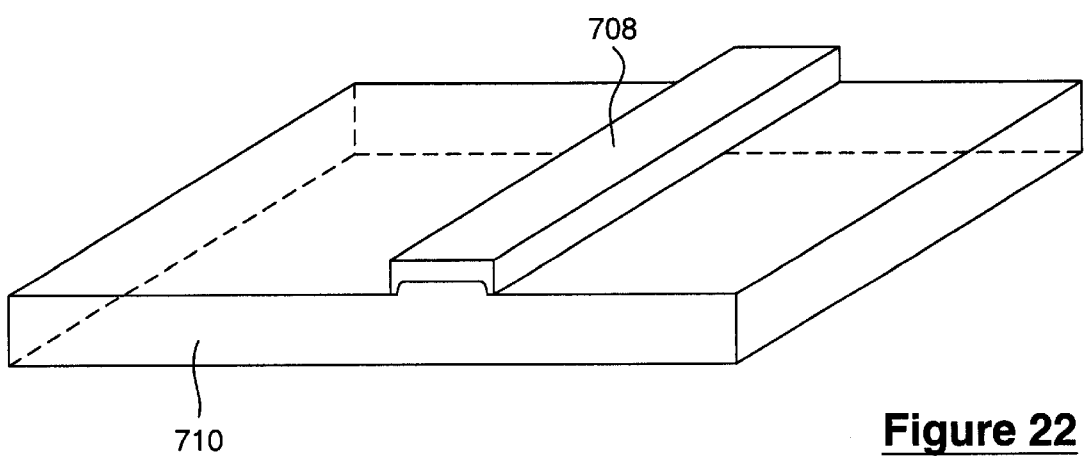

At this point there exist two usable patterned conductive films attached to plastic substrates. FIG. 19 shows the patterned coating 708 that remains on the embossed substrate 700 after lift-off. If it is desired to have the patterned conductors 708 from the embossed features stand proud of the plastic substrate, an additional lift-off can be employed. The first step of this optional lift-off is the application of a conformal coating 710 of a plastic material to the surface of the embossed substrate 700. The result of this step is depicted in FIG. 20. In this step the secondary plastic material 710 flows into the patterned features and adheres to the exposed surfaces of the remaining patterned conductors 708. When the plastic layer 710 is stripped from the embossed substrate 700, as depicted in FIG. 21, it pulls the patterned conductors 708 with it. FIG. 22 shows the (inverted) secondary plastic substrate 710 having patterned conductors 708 standing proud of thereon.

The above described emboss/lift-off process can be used to create the two separate conductor layers for each memory module layer. The memory module layer (22) can then be completed by sandwiching a semiconductor layer between the two conductor layers. For example, an appropriate layer or layers of materials for providing the diode junction and fuse functions, as discussed above, may be laid over the conductor pattern on one substrate and then the conductor pattern on the other substrate brought into physical contact with the exposed surface of the semiconductor layer. Such a process is illustrated diagrammatically in FIGS. 23, 24 and 25.

Figure 23:
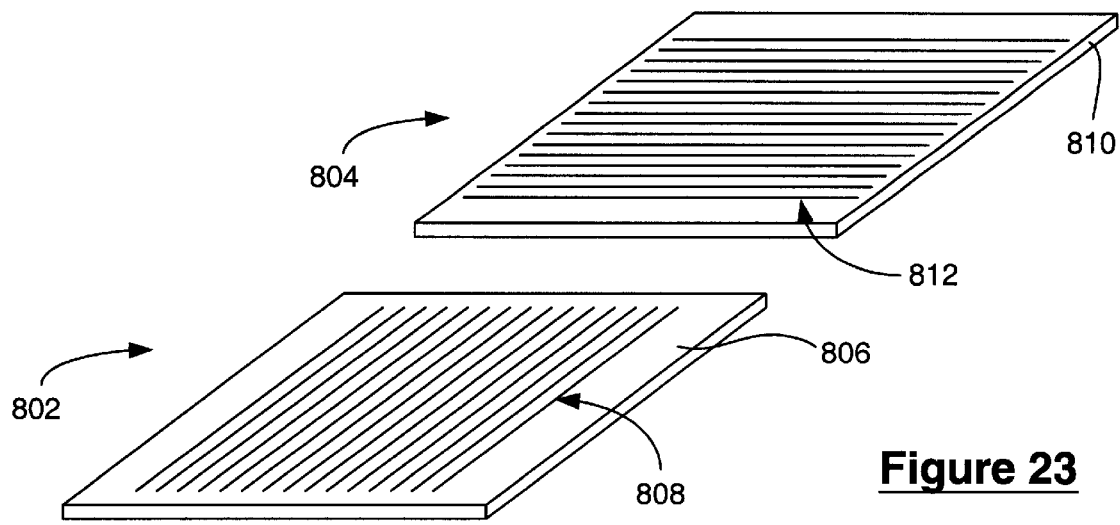
FIGS. 23 to 25 diagrammatically illustrate stages in a memory circuit sub-layer assembly process.

In FIG. 23, two sub-layers 802 and 804 are shown which may be separately created using the emboss/lift-off process. The sub-layer 802 comprises a first conductor arrangement 808 formed on substrate 806 which will form one of the conductor layers for a memory circuit. For example, the conductor arrangement 808 might comprise the column electrodes, the row address lines and row sense line(s), together with the contact pads and couplings associated therewith. The sub-layer 804 comprises a second conductor arrangement 812 formed on a substrate 810. The second conductor arrangement may comprise the row electrodes, column address lines, column sense line(s) and associated contacts and connections.

Figure 24:
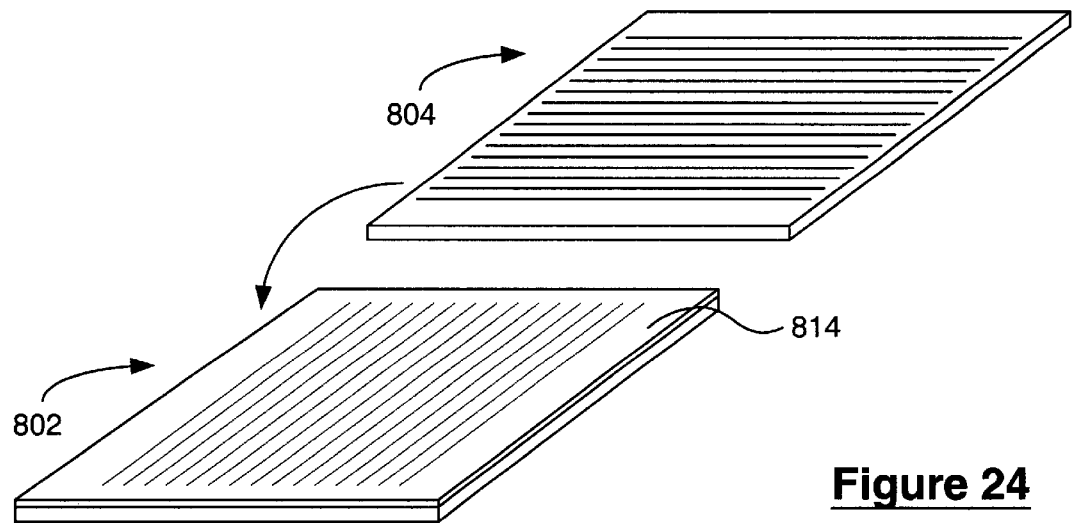
Figure 25:
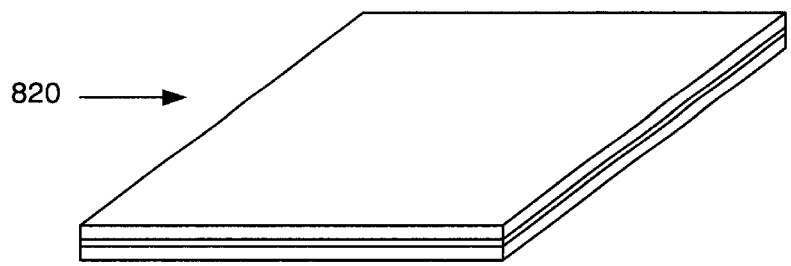

A semiconductor layer (814) or layers for forming diode junction and fuse functions is shown in FIG. 24 deposited over the first conductor arrangement on the substrate 806 of the first sub-layer 802. This forms electrical contact between the first conductor arrangement and one side of the semiconductor layer(s). The second sub-layer 804 is then placed inverted on top of the deposited semiconductor layer(s) so that the second conductor pattern makes contact with the other side of the semiconductor layer(s). The electrode conductors of the first and second sub-layers are arranged transverse (e.g. orthogonal) to one another to form cross-point junctions as discussed above. Since the circuit structures are all formed from cross-point diodes and interconnections therebetween, close alignment tolerance between the first and second sub-layers is not necessary. This forms the completed memory module layer illustrated at 820 in FIG. 25. A plurality of such layers can then be assembled into a memory module as described hereinbelow.

Depending upon the actual choice of semiconductor layer material, the sub-layers may be bonded to one another with the semiconductor material acting as a form of adhesive. Small molecular weight semiconductor materials have been shown capable of bonding quite strongly to the contact sub-layers. Alternatively, where plastic substrate material is employed, the plastic sub-layer materials may be bonded together by heating.

As will be appreciated more fully from the memory module assembly description which follows, it is desirable for the contact pads to be relatively wide in lateral extent to allow for easier alignment of interconnects between layers in the memory module. However, in the emboss/lift-off procedure described above, there is a limit to the width of an embossed region that can be created without the lift-off film (706) adhering to the conductor layer (708) in the embossed area. Accordingly, it is preferred that the contact pads be formed from a series of crossed conductors (on a single conductor layer) to avoid such difficulties.

Memory Module Fabrication Process

Construction of the memory module 20 involves the stacking of multiple layers of memory into an interconnected three-dimensional storage module. Depending on the process used to fabricate the memory the stacking may be achieved by the deposition of multiple crossbar layers on a common substrate or it may be performed by laminating complete layers each fabricated on its own thin substrate (such as those described hereinabove). U.S. Pat. No. 5,640,760 assigned to Thomson-CSF addresses the latter method of construction. Stacking and interconnect technology is also available from Irvine Sensors Corporation of Costa Mesa, Calif., and aspects of the processes are described in U.S. Pat. Nos. 5,424,920, 5,701,233 and 5,953,588, for example. Stacking and interconnect technology is also available from 3D Plus of Buc, France.

Figure 26:
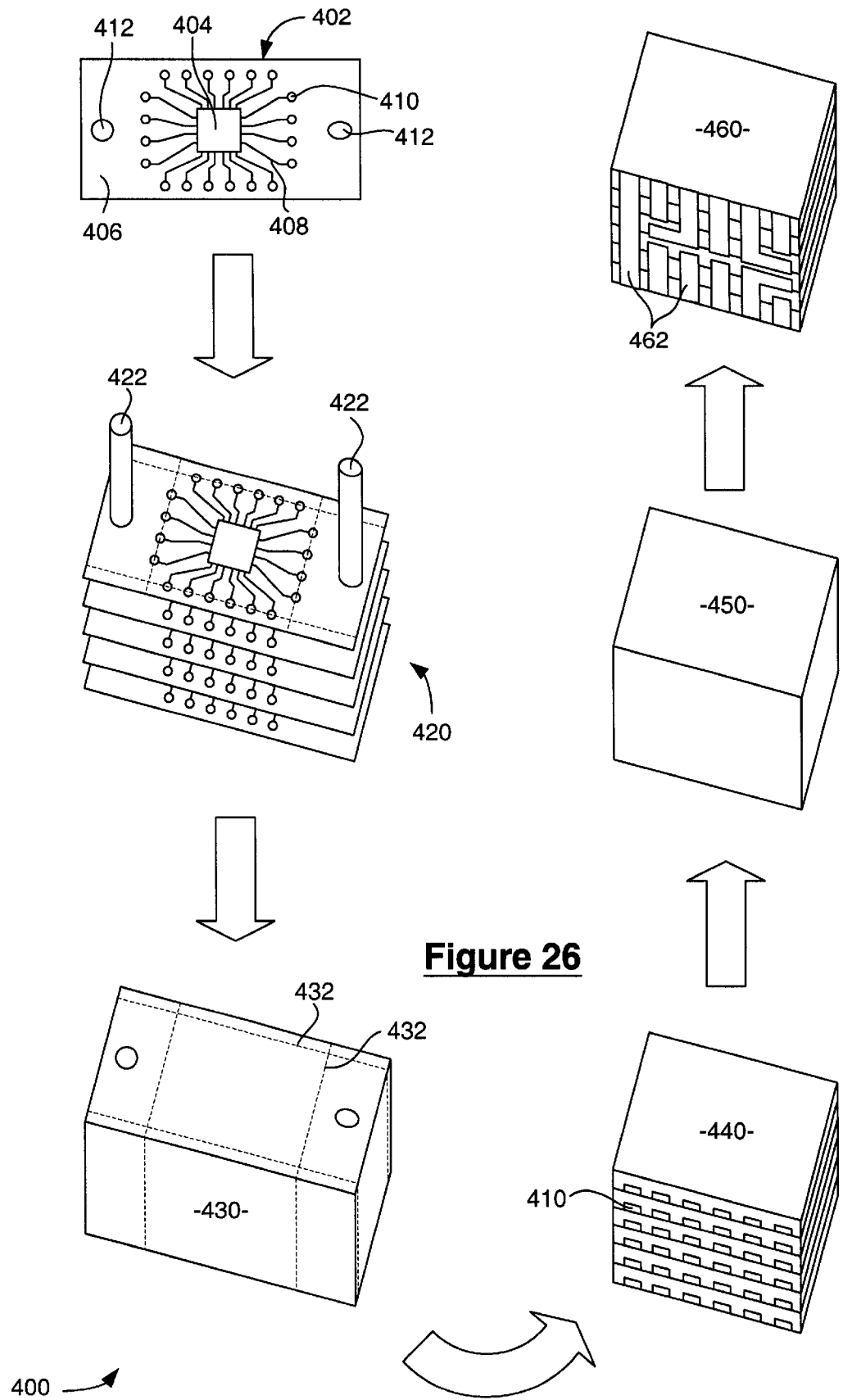
FIG. 26 is a diagrammatic illustration of a memory module fabrication process.

FIG. 26 illustrates the general steps of a process 400 for constructing a memory module 20 according to an embodiment of the invention from a plurality of layers 22 as above described. The process 400 begins with a fabricated integrated circuit layer 402, comprising memory array and addressing circuitry 404 formed on a plastic substrate 406. The layer 402 also has interconnect leads 408 extending from the input and output nodes of the circuitry 404 to respective linearly arranged contact pads 410. The layer 402 further includes alignment apertures 412 formed through the substrate 406. The layers 402 are preferably tested to ensure the circuitry thereon functions adequately before they are passed for assembly into a memory module.

At the next stage of the process 400, a plurality of layers 402 are aligned and stacked on top of one another, using alignment rods 422 extending through the alignment apertures 412, forming a stack of layers 420. The stack 420 can comprise a plurality of identical layers 402 all arranged in the same orientation. For example, up to about 50 layers may be used to form the stack 420. The layers of the stack are laminated together using an epoxy resin material or the like, which affixes the layers in their aligned arrangement and forms a sealed block 430.

Ends and sides are cut from the block 430 through the lines indicated at 432 in the Figure, using a high precision saw or other appropriate cutting instrument. As illustrated on the top layer of the stack 420 in the Figure, the planes through which the block 430 is cut extend through the lines of contact pads 410, thereby exposing end surfaces of the contact pads 410 from each layer in the laminated stack at the sides of the cut block. The block after the cutting procedure is shown at 440, illustrating the exposed ends of the contact pads 410 from each of the layers. It will be recognized that the features in the simplified drawing are not shown to relative scale, and some features, such as the exposed contact pad portions, are exaggerated for the purposes of illustration.

The cut block 440 is plated with a conductive metal covering, such as a Nickel/Aluminum alloy, forming a plated block 450. The metal covering makes electrical connection to the ends of the contact pads 410 exposed at the sides of the cut block 440 prior to plating. Finally, portions of the metal coating are removed from the plated block 450, using a laser grooving process, for example. The remaining portions 462 of the metal plate provide desired interconnections between contact pads of the various layers in the block. The metal plating can be patterned in any desired manner, for example to provide common connection between the addressing inputs of the memory module layers and separate connections to the I/O sense lines or the like. A completed memory module 20 is illustrated at 460, wherein the exterior surfaces of the remaining metal plate portions 462 provide electrical contacts for interface with external circuitry, such as the interface and control circuitry 14 of FIG. 1.

General Considerations

The memory system described herein has several features that make it particularly suitable for portable appliances requiring data storage, such as digital cameras (still picture and/or video), digital music players/recorders (e.g. MP3 players), personal digital assistants (PDAs), mobile telephones, etc. The memory system is able to provide data storage in capacities sufficient to be useful such appliances and can be produced at relatively low cost. Data can be written to the memory and thereafter it is permanently stored. Thus, a high capacity storage device (e.g. 100 MB to over 1 GB) can be provided at low cost (e.g. less than about $5) for permanent archival data storage with use in portable appliances.

The data storage is provided by a memory module that is produced at low cost by using inexpensive materials and processing technology. The memory module is formed of a plurality of layers each having a cross-point memory array. Many layers can be stacked to form a single memory module (although only up to 60 or so layers may fit within a Compact Flash card profile, for example), allowing the memory module to have a storage capacity of many multiples of the data storage possible on a single layer. Each layer is formed on an inexpensive flexible substrate, such as polymer or dielectric coated metal. This is much cheaper than a traditional single crystal silicon substrate, and allows for relatively fast and inexpensive fabrication processes to be used. The circuitry formed on each layer, comprising the cross-point memory array and associated addressing circuits, is designed to be simple in structure to enable uncomplicated fabrication processing. In particular, the memory array and addressing circuits are designed according to a permuted diode logic regime which allows both the memory array and addressing circuits to be fabricated using the same simple process.

Each memory module layer has two sets of electrode conductors arranged in respective layers with a semiconductor layer therebetween. The electrodes are arranged in an orthogonal matrix and at the intersection point of each pair of crossing electrodes a memory element is formed in the semiconductor material. The semiconductor layer allows for low temperature processing so as to be compatible with a plastic substrate, and may be an amorphous silicon material or constructed from one or more organic semiconductor materials. Where the electrode layers cross, separated by the semiconductor layer, a rectifying junction is formed between the two electrode conductors. Each rectifying junction can be considered as a diode in series with a fuse element, and such junctions form the basis of the memory array and the permuted diode logic addressing circuits. The addressing/multiplexing circuitry is constructed so that selective circuit interconnections can be broken or formed by application of electrical signals following fabrication, to form the selected diode interconnections between address lines and electrodes required for the addressing scheme.

The memory module layers are produced using simple and inexpensive processing. Through use of a flexible plastic or metal substrate, roll to roll processing is possible in fabrication of the circuits on the layers. Diode logic in the addressing circuits allow the same process to be used in fabricating the memory array and addressing circuits on a single substrate. Contact pads and conductors are also formed on the substrate for making external connection to the circuits. A plurality of the layers are stacked on top of one another and laminated together. The memory module is then completed by forming and patterning external contact tracks which make electrical contact with the contact pads at the edges of the memory module layers. These contact tracks couple the circuits on the respective layers together and provide connections to external circuitry.

The addressing circuitry included on each layer of the memory module facilitates a reduction in the number of externally accessible addressing lines that are required to read from or write to the memory elements in each layer. This allows a manageable number of the interconnections between the layers in the memory module and to external circuitry for a large storage capacity module. For example, using the diode logic addressing scheme described a memory array of 100,000,000 bits can be addressed by 56 external addressing lines. Power supply striping is also used, wherein power is supplied to only a portion of the memory array at a time. This can form part of the memory array addressing scheme and also reduces leakage currents in the array during data reading.

Interface and control circuitry is separate from the memory module, constructed for example in the form of a convention integrated circuit or circuits. The interface and control circuitry includes an addressing circuit for generating addressing signals to be applied to the memory module, and a sensing circuit for reading stored data. The sensing scheme is based on electrical current levels rather than electric charge, which allows the sensing circuitry to more easily read data remotely from the memory module. Furthermore, the data storage is based on a large resistance change when a memory element fuse is blown, which provides relatively large sensing signals.

The structure of the memory module has many possible variations whilst retaining the principles of the present invention. In the described embodiment a single memory array is fabricated on each layer, and the layers are aligned and stacked in top of one another. Each layer could alternatively include more than one memory array, and the layers could also be stacked in a different way, such as a fan-fold stack. It may also be advantageous in some applications to fabricate multiple circuit layers built up on a single substrate.

The principles of the present invention can be applied with many other variations to the circuits, structures, arrangements and processes described herein, as will be apparent to those of ordinary skill in the art, without departing from the scope of the invention as defined in the appended claims.

We claim:

1. An integrated circuit structure comprising:
  a first conductor layer having first and second conductor lines;
  a second conductor layer having a third conductor line in a crossing relationship with the first and second conductor lines; and
  an intermediate layer having at least one semiconductor material interposed between the first and second conductor layers at least where the third conductor line crosses the first and second conductor lines so as to form first and second circuit elements through the intermediate layer at the respective crossing junctions of the first and second conductor lines with the third conductor line;
  wherein the geometry of the first, second and/or third conductor lines at said crossing junctions being such that, upon application of a predetermined electrical signal through said first and second circuit connection elements, the first circuit connection element undergoes a permanent substantial change in resistance with respect to the second circuit connection element.

2. An integrated circuit structure as claimed in claim 1, wherein the geometry of the first, second and/or third conductor lines is constructed such that said predetermined electrical signal effects a greater electrical current density through said first circuit connection than said second circuit connection.

3. An integrated circuit structure as claimed in claim 1, wherein the geometry of the first, second and/or third conductor lines is constructed such that the width of the first and/or third conductor lines is narrowed in the region of the crossing junction thereof with respect to the crossing junction of the second and third conductor lines.

4. An integrated circuit structure as claimed in claim 1, wherein the geometry of the first, second and/or third conductor lines is constructed such that the width of the second and/or third conductor lines is broadened in the region of the crossing junction thereof with respect to the crossing junction of the first and third conductor lines.

5. An integrated circuit structure as claimed in claim 1 wherein, following application of said predetermined electrical signal, the first circuit connection element has a substantially higher resistance than the second circuit connection element.

6. An integrated circuit structure as claimed in claim 5, wherein said second circuit connection element includes a diode formed in the intermediate layer.

7. An integrated circuit structure as claimed in claim 1 wherein, following application of said predetermined electrical signal, the first circuit connection element has a substantially lower resistance than the second circuit connection element.

8. An integrated circuit structure as claimed in claim 7, wherein said first circuit connection element includes a diode formed in the intermediate layer.

9. An addressing circuit for a cross-point memory array having array electrode lines, the addressing circuit comprising at least one address line arranged to cross the array electrode lines, the array electrode lines and at least one address line being separated at the respective crossing junctions by a layer having at least one semiconductor material wherein circuit elements are formed through said layer at said junctions, the geometry of the at least one address line and/or the array electrode lines being constructed at said junctions such that application of a predetermined electrical signal through said circuit elements results in substantial alteration of resistance of selective said circuit elements according to said geometry.

10. An addressing circuit as claimed in claim 9, wherein said construction geometry comprises narrowed portions of said at least one address line and/or at least one of said array electrode lines at said junctions.

11. An addressing circuit as claimed in claim 9, wherein said construction geometry comprises narrowed portions of said at least one address line at said junctions.

12. An addressing circuit as claimed in claim 9, wherein said construction geometry comprises narrowed portions of at least one of said array electrode lines at said junctions.

13. An addressing circuit as claimed in claim 9, wherein said construction geometry comprises broadened portions of said at least one address line and/or at least one of said array electrode lines at said junctions.

14. An addressing circuit as claimed in claim 9, wherein said circuit elements include respective diodes formed by said layer.

15. An addressing circuit as claimed in claim 10, wherein the circuit elements formed at the junctions of narrowed address and/or array electrode lines undergo a substantial change in resistance as a result of application of said predetermined electrical signal.

16. An addressing circuit as claimed in claim 9, wherein the array electrode lines extend in parallel through said cross-point memory array, and wherein alternate ones of the array electrode lines extend from alternate sides of the cross-point memory array to thereat cross the at least one address line such that sub-sets of said crossing junctions are formed to opposite sides of the cross-point memory array.

17. An integrated circuit structure comprising:

a first conductor layer having first and second conductor lines;

a second conductor layer having a third conductor line in a crossing relationship with the first and second conductor lines; and an intermediate layer having at least one semiconductor material interposed between the first and second conductor layers at least where the third conductor line crosses the first and second conductor lines so as to form first and second circuit elements through the intermediate layer at the respective crossing junctions of the first and second conductor lines with the third conductor line;

wherein the widths of the first, second and third conductor lines at said crossing junctions are specified so that upon application of a predetermined electrical signal through said first and second circuit elements, the first circuit element undergoes a permanent substantial change in resistance with respect to the second circuit element.

18. The integrated circuit structure of claim 17 further comprising:

a fourth conductor line on the second conductor layer, the fourth conductor line in a crossing relationship with the first and second conductor lines;

wherein the first conductive line has different widths at the crossing junctions with the third and fourth conductor lines;

wherein the crossing of the fourth conductive line with the first conductive line forms a third circuit element in the intermediate layer;

wherein the application of the predetermined electrical signal through the first, second, and third circuit elements permanently changes the resistance of the first circuit element with respect to the resistance of the second and third circuit elements.

19. The integrated circuit structure of claim 17, wherein the widths of the first, second and/or third conductor lines is such that said predetermined electrical signal effects a greater electrical current density through said first circuit connection than said second circuit connection.

* * * * *